(12) United States Patent
Yokoyama et al.

(10) Patent No.: US 10,490,262 B2
(45) Date of Patent: Nov. 26, 2019

(54) SEMICONDUCTOR DEVICE

(71) Applicant: RENESAS ELECTRONICS CORPORATION, Tokyo (JP)

(72) Inventors: Yoshisato Yokoyama, Tokyo (JP); Takeshi Hashizume, Tokyo (JP); Toshiaki Sano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/914,458

(22) Filed: Mar. 7, 2018

(65) Prior Publication Data
US 2018/0315470 A1  Nov. 1, 2018

(30) Foreign Application Priority Data

Apr. 28, 2017  (JP) .................................. 2017-089635

(51) Int. Cl.
| | | |
|---|---|---|
| G11C 11/419 | (2006.01) | |
| G11C 11/417 | (2006.01) | |
| G11C 8/08 | (2006.01) | |
| G11C 29/02 | (2006.01) | |
| G11C 29/50 | (2006.01) | |
| G11C 5/14 | (2006.01) | |

(52) U.S. Cl.
CPC .............. *G11C 11/417* (2013.01); *G11C 8/08* (2013.01); *G11C 29/021* (2013.01); *G11C 29/028* (2013.01); *G11C 5/147* (2013.01); *G11C 29/50* (2013.01); *G11C 2029/5006* (2013.01); *G11C 2207/2254* (2013.01)

(58) Field of Classification Search
CPC ..................................................... G11C 11/419
USPC ...................................................... 365/189.11
See application file for complete search history.

(56) References Cited

U.S. PATENT DOCUMENTS

| 7,200,030 B2 | 4/2007 | Yamaoka et al. | |
|---|---|---|---|
| 2007/0109878 A1* | 5/2007 | Gouin ................... | G11C 11/419 |
| | | | 365/189.11 |

FOREIGN PATENT DOCUMENTS

JP      2004-206745 A      7/2004

* cited by examiner

*Primary Examiner* — Jason Lappas
(74) *Attorney, Agent, or Firm* — McDermott Will & Emery LLP

(57) ABSTRACT

A semiconductor device includes a memory unit having a memory cell driven by a voltage applied from power supply lines VSS and VDD, and a memory unit potential controller for adjusting the potential of the voltage applied to the memory cell. The memory unit potential controller includes a first potential adjustment part provided between the power supply lines VSS and ARVSS, and a second potential adjustment part provided between the power supply lines VDD and ARVSS. Further, the memory unit potential controller adjusts the potential of the power supply line ARVSS based on a first current supplied between the power supply line VSS and a first end portion of the memory cell through the first potential adjustment part, and adjusts a second current supplied between the power supply lines VDD and ARVSS through the second potential adjustment part, in order to rapidly stabilize the potential applied to the memory cell.

16 Claims, 16 Drawing Sheets

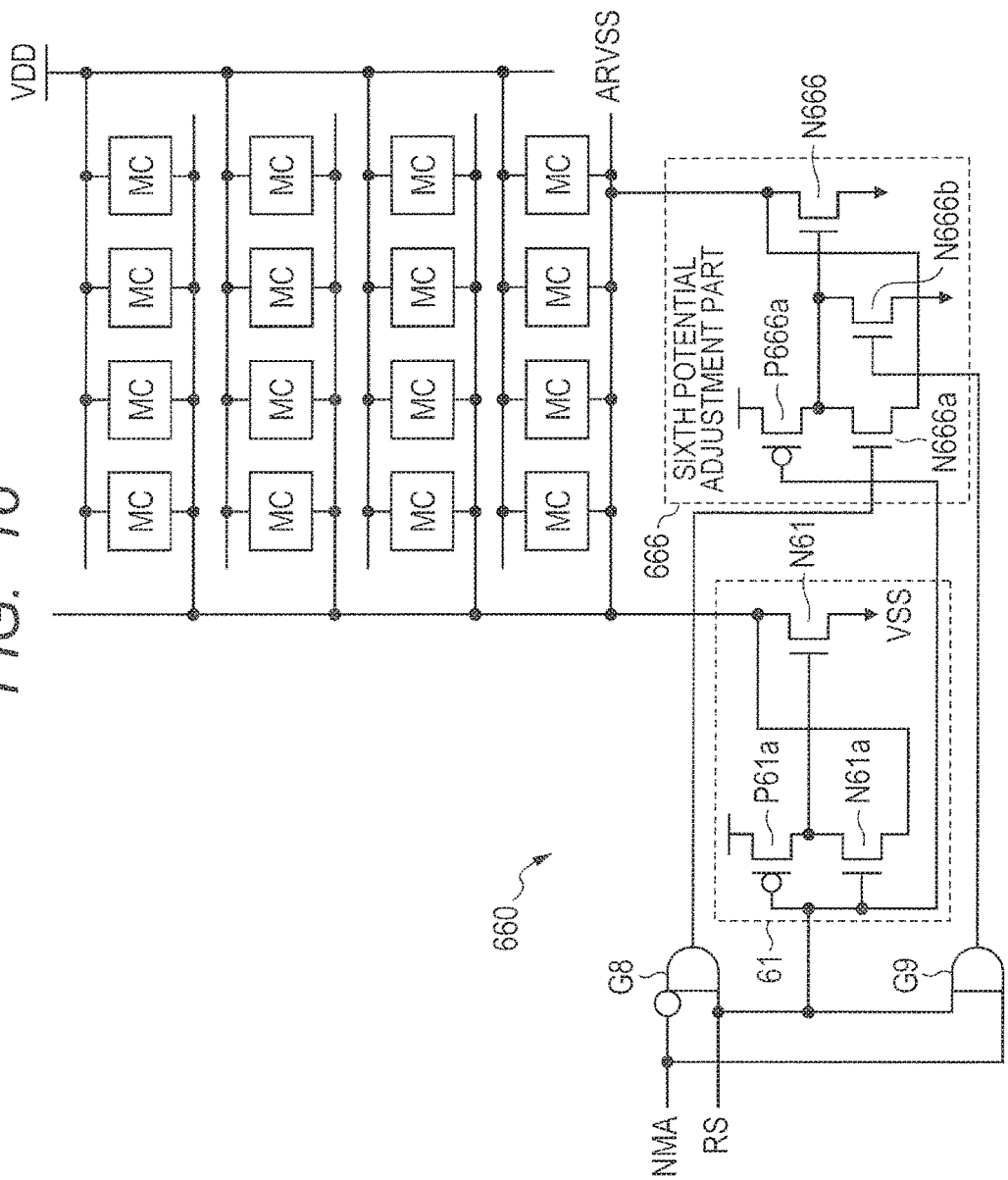

SEMICONDUCTOR DEVICE

CROSS-REFERENCE TO RELATED APPLICATIONS

The disclosure of Japanese Patent Application No. 2017-089635 filed on Apr. 28, 2017 including the specification, drawings and abstract is incorporated herein by reference in its entirety.

BACKGROUND

The present invention relates to a semiconductor device.

SRAM (Static Random Access Memory), which is one of the semiconductor memories, is a so-called non-volatile memory that can temporarily store various data. For example, SRAM is provided in a semiconductor device including a CPU (Central Processing Unit), and the like, to temporarily store data and information generated in various processes of the CPU. In general, low power consumption is required for semiconductor devices. For this reason, the leakage current should be reduced in the SRAM.

For example, Japanese Unexamined Patent Application Publication No. 2004-206745 (Patent Document 1) discloses a semiconductor memory device that can reduce the leakage current of a SRAM circuit and allow the SRAM circuit to operate at a high speed.

More specifically, in a memory array in which a plurality of static type memory cells, each of which includes a drive MOSFET (Metal Oxide semiconductor Field Effect Transistor), a transfer MOSFET, and a load element, are arranged, a semiconductor memory device includes: a switch that controls to couple a source line, which is coupled to a source electrode of the drive MOSFET, to a ground potential line when the memory cell is operated, and controls to disconnect the source line and the ground potential line when the memory cell is in a standby mode; and a source potential control circuit coupled between the source line and the ground potential. When the memory cell is in a standby mode, the source potential control circuit sets the source potential to an intermediate potential between ground potential and power supply potential.

SUMMARY

In the semiconductor memory device described in Japanese Unexamined Patent Application Publication No. 2004-206745, the low potential applied to the memory cell is set to a value higher than the source potential VSS by about 100 mV. In this way, a substrate bias effect occurs and the leakage current is reduced.

However, for example, if the potential of the memory cell on the lower potential side is set to a value different from the source potential VSS, it will take a considerable time until the potential of the memory cell is stabilized. Thus, there arises a problem of increase in the time for testing memory cells.

Further, in the case where the data retention characteristics at low temperature and at room temperature are lower than the data retention characteristics at high temperature, it is necessary to perform the test at low temperature and at room temperature. However, the leakage current at low temperature and at room temperature is smaller than the leakage current at high temperature. Thus, the time until the potential of the memory cell is stabilized is increased at low temperature and at room temperature as compared to the time required at high temperature. As a result, the test time is further increased.

Other objects, advantages and novel features of the present disclosure will be set forth in the following detailed description when considered in conjunction with the drawings.

While semiconductor devices according to various embodiments are described in this specification, the following is a description of a semiconductor device according to an embodiment. That is a semiconductor device includes: a memory unit having a memory cell that is driven by a voltage applied from a first source and a second source; and a potential control unit for controlling the potential of the voltage applied to the memory cell. The potential control unit includes: a first potential adjustment part provided between the first source and a first end portion of the memory cell; and a second potential adjustment part provided between the second source and the first end portion of the memory cell. Further, the potential control unit adjusts the potential of the first end portion of the memory cell, based on a first current supplied between the first source and the first end portion through the first potential adjustment part and based on a second current supplied between the second source and the first end portion through the second potential adjustment part.

According to an embodiment, there is provided a semiconductor device that can rapidly stabilize the potential applied to the memory cell.

BRIEF DESCRIPTION OF THE DRAWINGS

FIG. 16 is a diagram showing an example of the configuration of a memory unit potential controller according to a seventh embodiment of the present invention.

DETAILED DESCRIPTION

Figure 1:
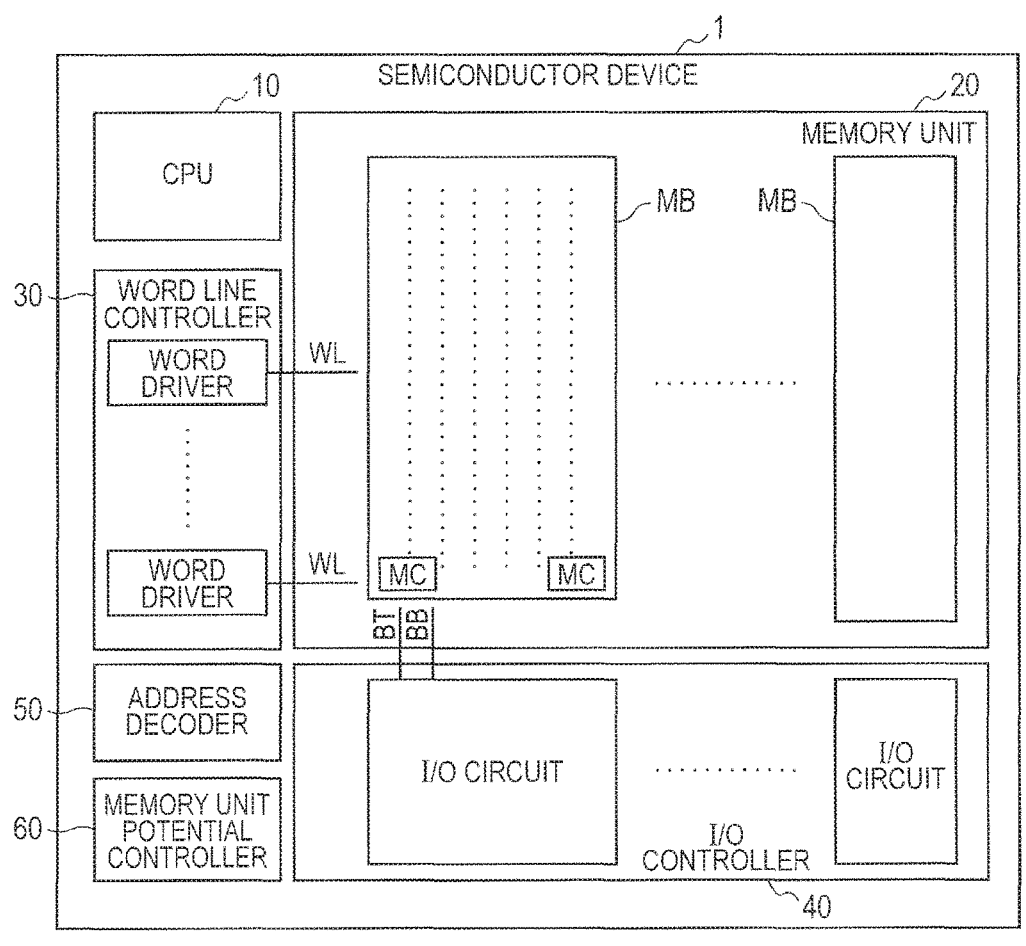
FIG. 1 is a block diagram showing an example of the configuration of a semiconductor device according to a first embodiment of the present invention.

Hereinafter, preferred embodiments of the present invention will be described in detail with reference to the accompanying drawings. Note that in all the drawings for describing the embodiments, like parts are basically designated by the same reference numerals and the repetitive description thereof will be omitted.

First Embodiment

<Configuration of the Semiconductor Device>

FIG. 1 is a block diagram showing an example of the configuration of a semiconductor device according to a first embodiment of the present invention. As shown in FIG. 1, for example, a semiconductor device 1 includes a CPU 10, a memory unit 20, a word line controller 30, an I/O controller 40, an address decoder 50, a memory unit potential controller 60, and the like.

The CPU 10 is configured with a computer and performs processes such as, for example, controlling the respective units that configure the semiconductor device 1.

As shown in FIG. 1, the memory unit 20 includes a plurality of memory blocks MB. For example, these memory blocks MB are arranged along the X-axis direction (first direction). As shown in FIG. 1, each memory block MB includes a plurality of memory cells MC. The memory cells MC are arranged, for example, in a matrix form along the X-axis direction and along Y-axis direction (second direction). Note that in the following descriptions, memory cells arranged in a matrix form in each memory block MB may be referred to as a memory cell array.

Figure 2:
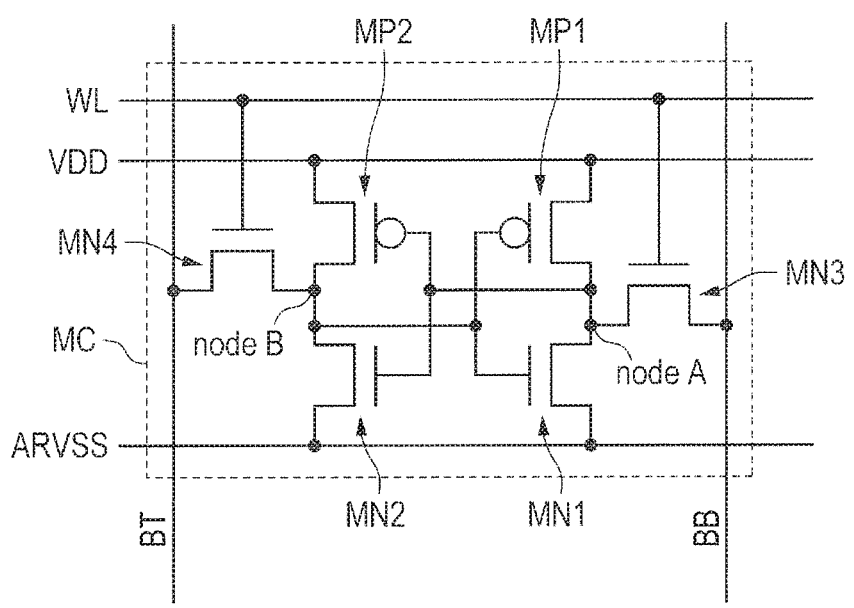
FIG. 2 is a circuit diagram showing an example of the configuration of a memory cell according to the first embodiment of the present invention.

FIG. 2 is a circuit diagram showing an example of the memory cell configuration according to the first embodiment of the present invention. FIG. 2 illustrates a SRAM, which is configured with six transistors (6 cells), as a memory cell MC. Note that the SRAM need not necessarily be configured with 6 cells. For example, the SRAM may be configured with 8 cells or may have other configurations.

As shown in FIG. 2, the memory cell MC is coupled to a word line WL, a pair of bit lines (BB, BT), a power supply line VDD that supplies a high potential power supply (second source), and a power supply line ARVSS that supplies a low potential power supply. Further, the power supply ARVSS is coupled to a power supply line (first source) that supplies a low potential through a first potential adjustment part 61 of the memory unit potential controller 60 described below.

For example, the word line WL is commonly provided in the memory cells MC for one row that are arranged along the X-axis direction. In other words, one word line WL extends in the X-axis direction and is coupled to the memory cells MC for one row. Thus, the number of word lines WL is equal to the number of rows of the matrix of memory cells MC.

Further, for example, a pair of bit lines (BB, BT) is commonly provided in the memory cells MC for one column that are arranged along the Y-axis direction. In other words, the pair of bit lines (BB, BT) extends in the Y-axis direction and is coupled to the memory cells MC for one column. Thus, the number of pairs of bit lines (BB, BT) is equal to the number of columns of the matrix of memory cells MC.

As shown in FIG. 2, the memory cell MC includes a first inverter configured with two transistors (MP1, MN1), a second inverter configured with two transistors (MP2, MN2), and two transistors (MN3, MN4) called transfer gates.

In the first inverter, one end of the transistor MP1 and one end of the transistor MN1 are coupled to each other. Further, the other end (second end) of the transistor MP1 is coupled to the power supply line VDD, and the other end (first end) of the transistor MN1 is coupled to the power supply line ARVSS. The output terminal of the first inverter (one end of the transistors (MP1, MN1)) is coupled to a storage node NODE A, and then is coupled to the input terminal of the second inverter (the gate of the transistors (MP2, MN2)) through the storage node NODE A.

In the second inverter, one end of the transistor MP2 and one end of the transistor MN2 are coupled to each other. Further, the other end (second end) of the transistor MP2 is coupled to the power supply line VDD, and the other end (first end) of the transistor MP2 is coupled to the power supply line ARVSS. The output terminal of the second inverter (one end of the transistors (MP2, MN2)) is coupled to a storage node NODE B, and then is coupled to the input terminal of the first inverter (the gate of the transistors (MP1, MN1)) through the storage node NODE B.

The transistor MN3 as the transfer gate is configured in such a way that one end is coupled to the storage node NODE A and the other end is coupled to the bit line BB. At the same time, the gate of the transistor MN 3 is coupled to the word line WL. Further, the transistor NM4 as the transfer gate is configured in such a way that one end is coupled to the storage node NODE B and the other end is coupled to the bit line BT. At the same time, the gate of the transistor MN4 is coupled to the word line WL.

The transistors (MP1, MP2) included in each inverter are configured, for example, with P-channel MOSFET (Metal Oxide Semiconductor Field Effect Transistor). Further, the transistors (MN1, MN2) included in each inverter as well as the transistors (NM3, NM4) as the transfer gates are configured, for example, with N-channel MOSFET. Note that the P-channel MOSFETs (MP1, MP2) configuring each inverter are respectively referred to as load MOS, and the N-channel MOSFETs (MN1, MN2) configuring each inverter are respectively referred to as drive MOS. Note that in the following descriptions, the P-channel MOSFET is referred to as PMOS and the N-channel MOSFET is referred to as NMOS.

Leakage current flows between the power supply line VDD (the second end) and the power supply line ARVSS (the first end) in the memory cell MC. Note that the potential of the power supply line VDD is higher than the potential of the power supply line ARVSS, so that the leakage current flows from the power supply line VDD to the power supply line ARVSS.

For example, the word line controller 30 includes a plurality of word drivers. For example, the word drivers are provided corresponding to each of the word liens WL that extend in the X-axis direction. Thus, the word drivers are provided in such a way that, for example, the number of word drivers is equal to the number of word lines WL and each word driver is coupled to the corresponding line WL.

The I/O controller 40 includes a plurality of I/O circuits. For example, the I/O circuits are provided corresponding to each pair of bit lines (BB, BT) extending in the Y-axis direction. However, the I/O circuit may be provided corresponding to a plurality of pairs (for example, 8 pairs) of bit lines (BB, BT). Thus, each I/O circuit is coupled to the corresponding one pair or pairs of bit lines (BB, BT).

The address decoder 50 selects the memory cell MC to be accessed based on the input address data. For example, the address decoder detects the address (row and column) on the matrix by decoding the input address data. The address decoder activates the word driver corresponding to the detected row. Then, the activated word driver asserts the corresponding word line WL.

Further, the address decoder 50 activates the I/O circuit corresponding to the detected column. Then, the activated I/O circuit asserts the corresponding pair or pairs of bit lines (BB, BT).

Then, the memory cell MC in which both the word line WL and one pair of bit lines (BB, BT) are asserted is the one that is selected based on the address data. Operations such as data write and data read are performed on the selected memory cell MC. It should be noted that when the I/O circuit is provided every pair of bit lines (BB, BT), reading and writing is performed on each bit. It should also be noted that when the I/O circuit is provided every 8 pairs of bit lines, reading and writing is performed every 8 bits.

Figure 3:
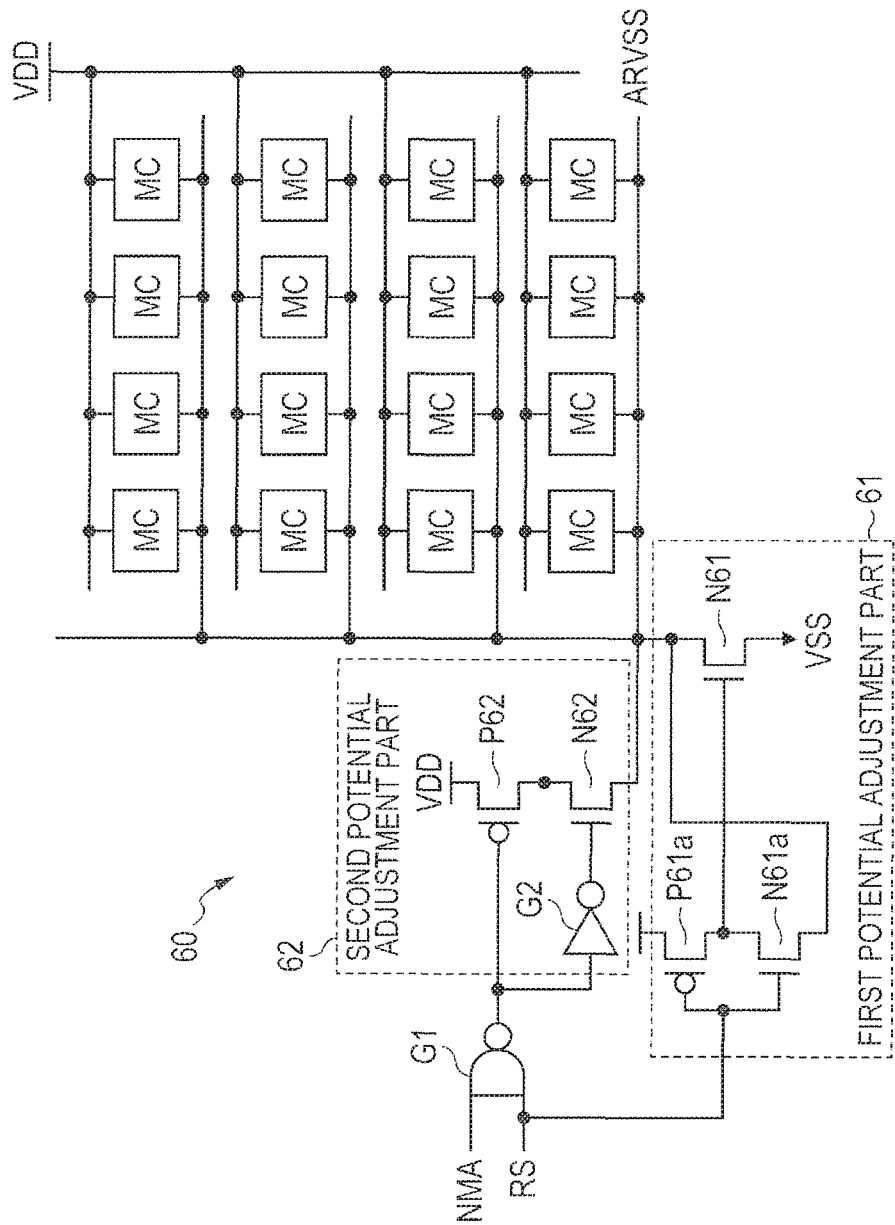
FIG. 3 is a diagram showing an example of the configuration of a memory unit potential controller according to the first embodiment of the present invention.

FIG. 3 is a diagram showing an example of the configuration of the memory unit potential controller according to the first embodiment of the present invention. Note that FIG. 3 shows the memory unit potential controller 60 and a plurality of memory cells MC, in which the connection relationship between the memory unit potential controller 60 and the memory cells MC is made clear.

The memory unit potential controller 60 is a circuit block that adjusts the potential of the voltage applied to the memory cell MC. As shown in FIG. 3, for example, the memory unit potential controller 60 includes a first potential adjustment part 61, a second potential adjustment part 62, and a gate circuit G1.

As shown in FIG. 1, for example, the gate circuit G1 is configured with an NAND circuit with two inputs. Signal lines NMA and RS are coupled to each of the input terminals of the gate circuit G1. Further, the signal line RS is also coupled to the first potential adjustment part 61. On the other hand, the output terminal of the gate circuit G1 is coupled to the second potential adjustment part 62.

As shown in FIG. 3, the first potential adjustment part 61 includes transistors N61, P61a, and N61a. Of the three transistors, for example, the transistors N61 and N61a are configured with NMOS and the transistor P61a is configured with PMOS.

One end of the transistor P61a and one end of the transistor N61a are coupled to each other. The other end of the transistor P61a is coupled to the power supply line VDD and the other end of the transistor N61a is coupled to the power supply line ARVSS. The gate of the transistors P61a and N61a is coupled to the signal line RS. One end of the transistors P61a and N61a is coupled to the gate of the transistor N61.

One end of the transistor N61 is coupled to the power supply line VSS (first source). The other end of the transistor N61 is coupled to the power supply line ARVSS (first end portion of the memory cell MC). In other words, the other end of the transistor N61 is coupled to the first end portion of the memory cell MC as well as the other end of the transistor N61a. The transistor N61 is a transistor that supplies a first current between the power supply line VSS and the power supply line ARVSS.

As shown in FIG. 3, for example, the second potential adjustment part 62 includes a gate circuit G2 and transistors P62 and N62. Of the two transistors, for example, the transistor N62 is configured with NMOS and the transistor P62 is configured with PMOS.

One end of the transistor P62 and one end of the transistor N62 are coupled to each other. The other end of the transistor P62 is coupled to the power supply line VDD (second source), and the other end of the transistor N62 is coupled to the power supply line ARVSS. The gate of the transistor P62 is coupled to the output terminal of the gate circuit G1. The transistors P62 and N62 are transistors that supply a second current between the power supply line VDD and the power supply line ARVSS.

The gate circuit G2 is configured, for example, with an inverter circuit. The input terminal of the gate circuit G2 is coupled to the output terminal of the gate circuit G1. Then, the output terminal of the gate circuit G2 is coupled to the gate of the transistor N62.

Note that in the second potential adjustment part 62 according to the present embodiment, the current supply source that allows the second current to flow is configured in such a way that the PMOS transistor P62 and the NMOS transistor N62 are coupled in series. However, the present invention is not limited to this configuration. For example, the current supply source may be configured by coupling a plurality of PMOS transistors in series or by coupling a plurality of NMOS transistors in series. Furthermore, it may be possible to configure the current supply source with a single transistor or by coupling a plurality of transistors in parallel.

The transistors P62 and N62 of the second potential adjustment part 62 are configured to apply the second current whose current value is greater than the leakage current of the memory cell MC. For example, the transistors P62 and N62 are configured to apply the second current that is greater than the sum of the leakage currents of a plurality of memory cells MC coupled thereto. In the example shown in FIG. 3, the transistors P62 and N62 are coupled to the memory cells MC that configure the memory array of the memory block MB. Thus, the transistors P62 and N62 are configured to supply the second current whose current value is greater than the sum of the leakage currents of the memory cells MC.

Figure 10:
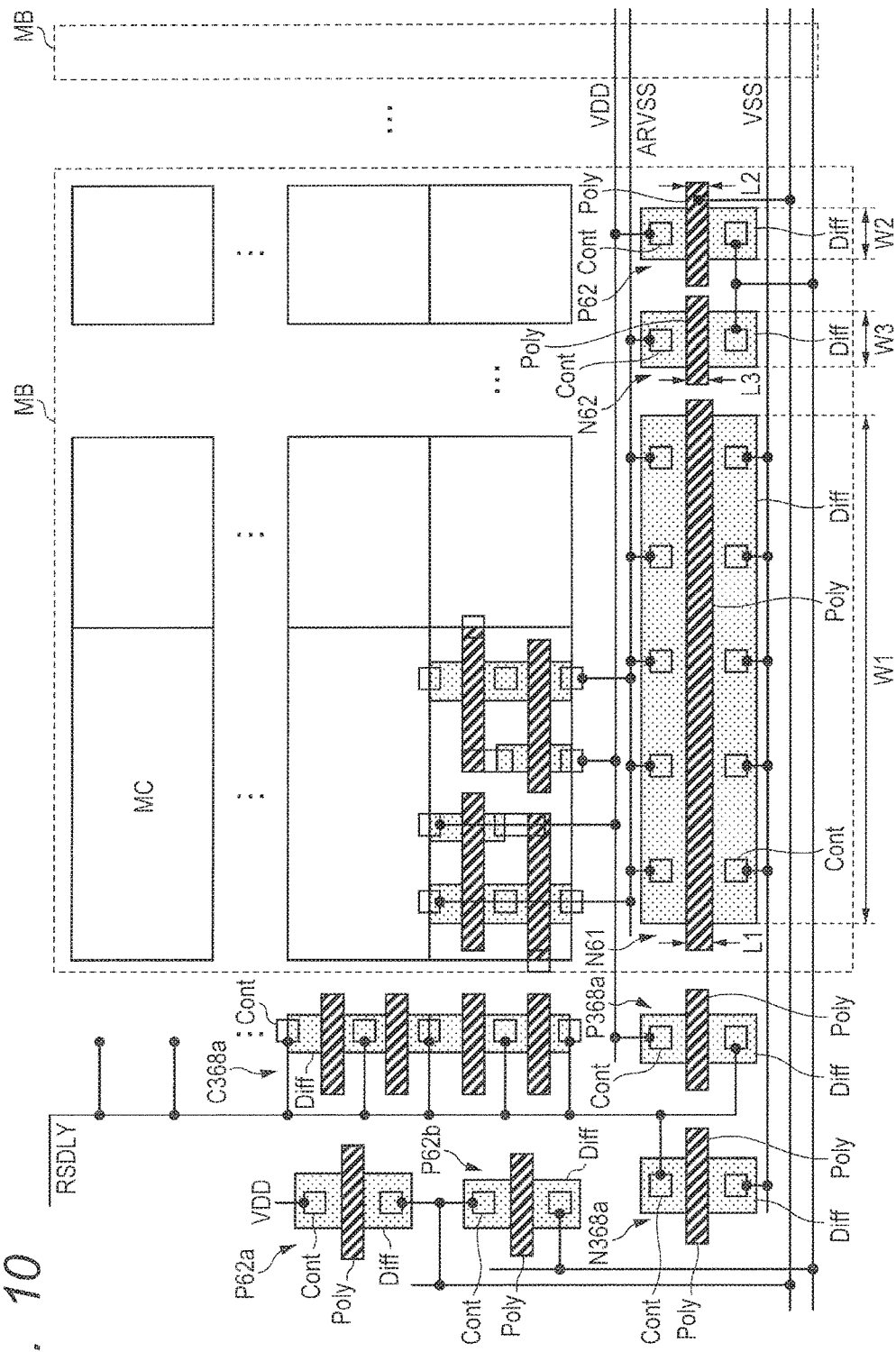
FIG. 10 is a layout diagram showing an example of the configuration of the memory unit potential controller according to the fourth embodiment of the present invention.

Further, the transistor N61 of the first potential adjustment part 61 is configured in such a way that the current supply capability is greater than the current supply capability of the transistors P62 and N62 of the second potential adjustment part 62. For example, it is assumed that the transistor N61 has a channel length L1 and a channel width W1. Further, it is assumed that the transistor P62 has a channel length L2 and a channel width W2, and the transistor N62 has a channel length L3 and a channel width W3. Note that examples of the channel lengths L1 to L3 and the channel widths W1 to W3 of the respective transistors N61, P62, and N62 are shown in FIG. 10, which will be described below.

At this time, the transistors N61, P62, and N62 are configured in such a way that the ratio (W1/L1) of the channel width to the channel length of the transistor N61 is greater than the respective ratios (W2/L2, W3/L3) of the channel widths to the channel lengths of the transistors P62 and N62, by comparing the ratios (W1/L1, W2/L2, W3/L3) of the channel widths to the channel lengths of the respective transistors. Here, the ratio (W/L) of the channel width to the channel length of the transistor represents the current supply capability of the transistor, which shows that the shorter the channel length (L) and the longer the channel width (W), the higher the current supply capability is.

Note that the current supply capability of the transistor N61 may be higher than the lower current supply capability of the two transistors P62 and N62. For example, if the current supply capability of the transistor P62 is lower than the transistor N62, the transistor P62 may be configured in such a way that the current supply capability is higher than the transistor P62. On the other hand, if the current supply capability of the transistor N62 is lower than the transistor P62, the transistor N61 may be configured in such a way that the current supply capability is higher than the transistor N62. In this way, the first potential adjustment part 61 is configured in such a way that the current supply capability is higher than the second potential adjustment part 62.

Of the elements configuring the first potential adjustment part 61, for example, the transistor N61 may be provided in each memory block MB. In this case, as shown in FIG. 3, the transistor N61 is commonly provided in the memory cells MC that configure the memory cell array of the memory block MB. In this way, it is possible to reduce the number of memory cells MC coupled to the transistor N61, and thus to prevent an increase in size of the transistor N61. In addition, the size of the transistor N61 can be kept constant when the number of memory blocks MB increases or decreases. As a result, the degree of freedom of the design is enhanced.

Further, of the elements configuring the second potential adjustment part 62, for example, the transistors P62 and N62 may be provided in each memory block MB. In this case, as shown in FIG. 3, the transistors P62 and N62 are commonly provided in the memory cells MC that configure the memory cell array of the memory block MB. In this way, it is possible to reduce the number of memory cells MC coupled to the transistors P62 and N62, and thus to prevent an increase in size of the transistors P62 and N62. In addition, the number of memory cells MC coupled to the memory block MB is fixed when the number of memory blocks MB increases or decreases, so that the size of the transistors P62 and N62 can be kept constant.

[Adjustment of the Potential Applied to the Memory Cell]

Next, a description will be given of a method for adjusting the potential applied to the memory cell MC by using the memory unit potential controller 60. Note that the potential adjustment using the memory unit potential controller 60 is, for example, performed mainly in product testing.

Figure 4:
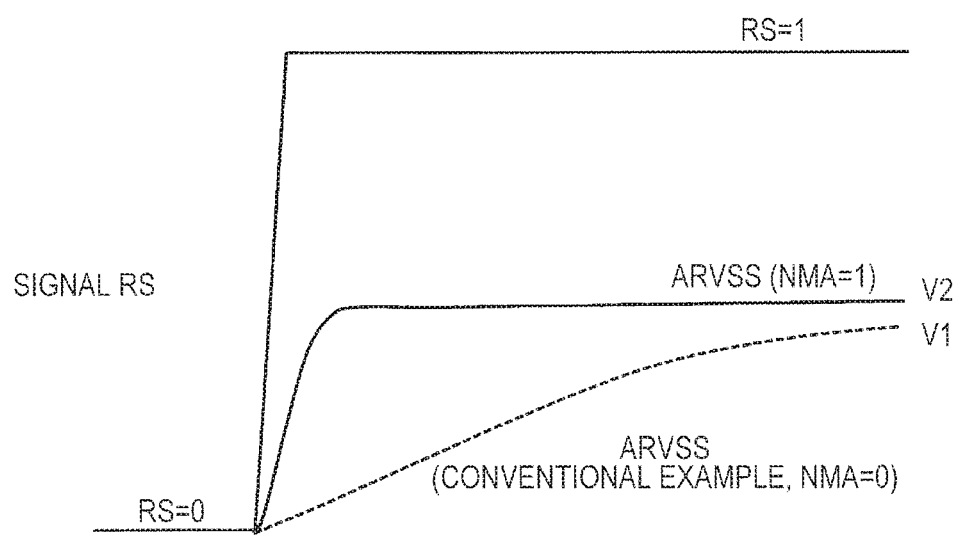
FIG. 4 is a diagram showing the change in potential of a power supply line when the potential is adjusted by the memory unit potential controller according to the first embodiment of the present invention.

FIG. 4 is a diagram showing the change in potential of a power supply line when the potential is adjusted by the memory unit potential controller according to the first embodiment of the present invention. Note that FIG. 4 shows the change in potential of the power supply line ARVSS. Further, FIG. 4 also shows the change in the potential when the potential adjustment according to the present embodiment is not performed. In the past, there has been no circuit block corresponding to the second potential adjustment part 62. Thus, as a conventional example, the figure shows the change in the potential when the potential of the signal line NMA is set to a low level "0" and the second potential adjustment part 62 is set to an off state.

When the adjustment of the potential is not performed by the memory unit potential controller 60, the potential of the signal line RS is set to low level. At this time, a high level signal "1" is output from the output terminal of the gate circuit G1. In the second potential adjustment part 62, a high level signal is input to the input terminal of the gate circuit G2, so that a low level signal is output from the output terminal. Thus, the high level signal is input to the gate of the transistor P62, and at the same time, the low level signal is input to the gate of the transistor N62. Thus, both the transistors P62 and N62 are switched to the off state. In response to this, the second current does not flow between the power supply line VDD and the power supply line ARVSS through the second potential adjustment part 62.

When the potentials of both the signal lines NMA and RS are set to high level, the potential adjustment is performed by the memory unit potential controller 60. In other words, because a high level signal is input to the two input terminals of the gate circuit G1, a low level signal is output from the output terminal.

Next, in the second potential adjustment part 62, a low level signal is input to the input terminal of the gate circuit G2, so that a high level signal is output from the output terminal. Thus, the low level signal is input to the gate of the transistor P62, and at the same time, the high level signal is input to the gate of the transistor N62, so that both the transistors P62 and N62 are switched to an on state. Then, the transistors P62 and N62 supplies the second current between the power supply line VDD and the power supply line ARVSS. Note that the power supply line VDD is coupled to the high potential power supply, so that the potential of the power supply line VDD is higher than the potential of the power supply line ARVSS. Thus, the second current flows from the power supply line VDD to the power supply line ARVSS.

Next, in the first potential adjustment part 61, the transistor P61a is switched to the off state, and the transistor N61a is switched to the on state. Then, the gate of the transistor N61 is coupled to the other end (power supply line ARVSS) of the transistor N61 through the transistor N61a. Thus, the potential of the gate of the transistor N61 is set to a value that is approximately equal to a threshold voltage of the transistor N61a and is higher than the potential of the power supply line ARVSS. In response to this, the transistor N61 is coupled to a diode through the transistor N61a. In other words, the transistor N61 functions as a diode coupled transistor (first diode coupled transistor).

Thus, the transistor N61 allows the first current to flow between the power supply line VSS and the power supply line ARVSS, while reducing the current amount (current value) of the first current. Note that the power supply line VSS is coupled to the low potential power supply, so that the potential of the power supply line VSS is lower than the potential of the power supply line ARVSS. Thus, the first current flows from the power supply line ARVSS to the power supply line VSS.

In this way, the leakage current of the memory cell MC flows into the power supply line ARVSS, and at the same time, the second current flows into the power supply line ARVSS through the second potential adjustment part 62. On the other hand, the first current flows out of the power supply line ARVSS through the first potential adjustment part 61. The memory unit potential controller 60 adjusts the potential of the power supply line ARVSS (the first end portion of the memory cell MC) based on these currents.

The change of the potential of the power supply line ARVSS that is adjusted as described above by the memory unit potential controller 60 will be described. When the signal line RS is set to high level, the first potential adjustment part 61 and the second potential adjustment part 62 are switched to the on state. Then, the leakage current of the memory cell array flows into the power supply line ARVSS, and at the same time, the second current flows into the power supply line ARVSS through the transistors P62 and N62. The potential of the power supply line ARVSS rapidly increases due to these currents as shown in FIG. 4. Further, the first current flows out of the power supply line ARVSS through the transistor N61, and the potential of the power supply line ARVSS decreases due to this current. Then, the potential of the power supply line ARVSS is controlled to maintain a predetermined potential (for example, V2) based on these currents.

Effects of the Present Embodiment

According to the present embodiment, the second current is supplied to the power supply line ARVSS from the power supply line VDD through the transistors P62 and N62 of the second potential adjustment part 62. According to this configuration, the second current flows into the power supply line ARVSS, so that it is possible to rapidly increase the potential of the power supply line ARVSS and to stabilize at the increased potential. In this way, the potential of the power supply line ARVSS can be set to a predetermined potential that is slightly higher than the potential of the power supply line VSS in a short time. In addition, this will result in a reduction in the product testing time without impairing the data retention capability of the memory cell MC.

Further, according to the present embodiment, the transistors P62 and N62 of the second potential adjustment part 62 are configured to apply the second current whose current value is greater than the leakage current of the memory cell MC. According to this configuration, more current flows into the power supply line ARVSS, so that it is possible to increase the potential of the power supply line ARVSS more rapidly. Thus, it is possible to set the potential of ARVSS to a predetermined potential in a shorter time.

Further, according to the present embodiment, the second potential adjustment part 62 is coupled to the first end portion of the memory cells MC configuring the memory cell array. Further, the second potential adjustment part 62 is configured to apply the second current that is greater than the sum of the leakage currents of the memory cell arrays. According to this configuration, even if the second potential adjustment part 62 is coupled to a plurality of memory cells MC, it is possible to increase the potential of the power supply line ARVSS more rapidly, and thus it is possible to set the potential of ARVSS to a predetermined potential in a shorter time.

Further, according to the present embodiment, the first potential adjustment part 61 is configured in such a way that the current supply capability is higher than the second potential adjustment part 62. More specifically, the transistor N61 is configured in such a way that the ratio (W1/L1) of the channel width to the channel length of the transistor N61 is greater than the respective ratios (W/L2, W3/L3) of the channel widths to the channel lengths of the transistors P62 and N62.

According to this configuration, the current flowing into the power supply line ARVSS flows out as the first current through the transistor N61, so that the potential of the power supply line ARVSS can be adjusted appropriately. In this way, it is possible to perform the test without impairing the data retention capability of the memory cell MC.

Further, according to the present embodiment, the transistor N61 of the first potential adjustment part 61 functions as a diode coupled transistor through the transistor N61*a*. According to this configuration, the current value of the first current flowing through the transistor N61 is adjusted by the transistor N61*a*, so that the potential of the power supply line ARVSS can be adjusted appropriately. In this way, it is possible to perform the test without impairing the data retention capability of the memory cell MC.

Note that since the second potential adjustment part 62 did not exist in the past, only the leakage current of the memory cell array flowed into the power supply line AVRSS. Thus, as shown in FIG. 4, the potential of the power supply line ARVSS increased more gently than in the present embodiment. For this reason, it took a considerable time until the potential of the power supply line ARVSS increases to a predetermine potential (for example, V1).

Second Embodiment

Next, a second embodiment of the present invention will be described. The present embodiment describes the case where the current amount of the second current is adjusted in a memory unit potential controller. Note that, in principle, the description of the parts overlapping with those described in the embodiment will be omitted below.

Figure 5:
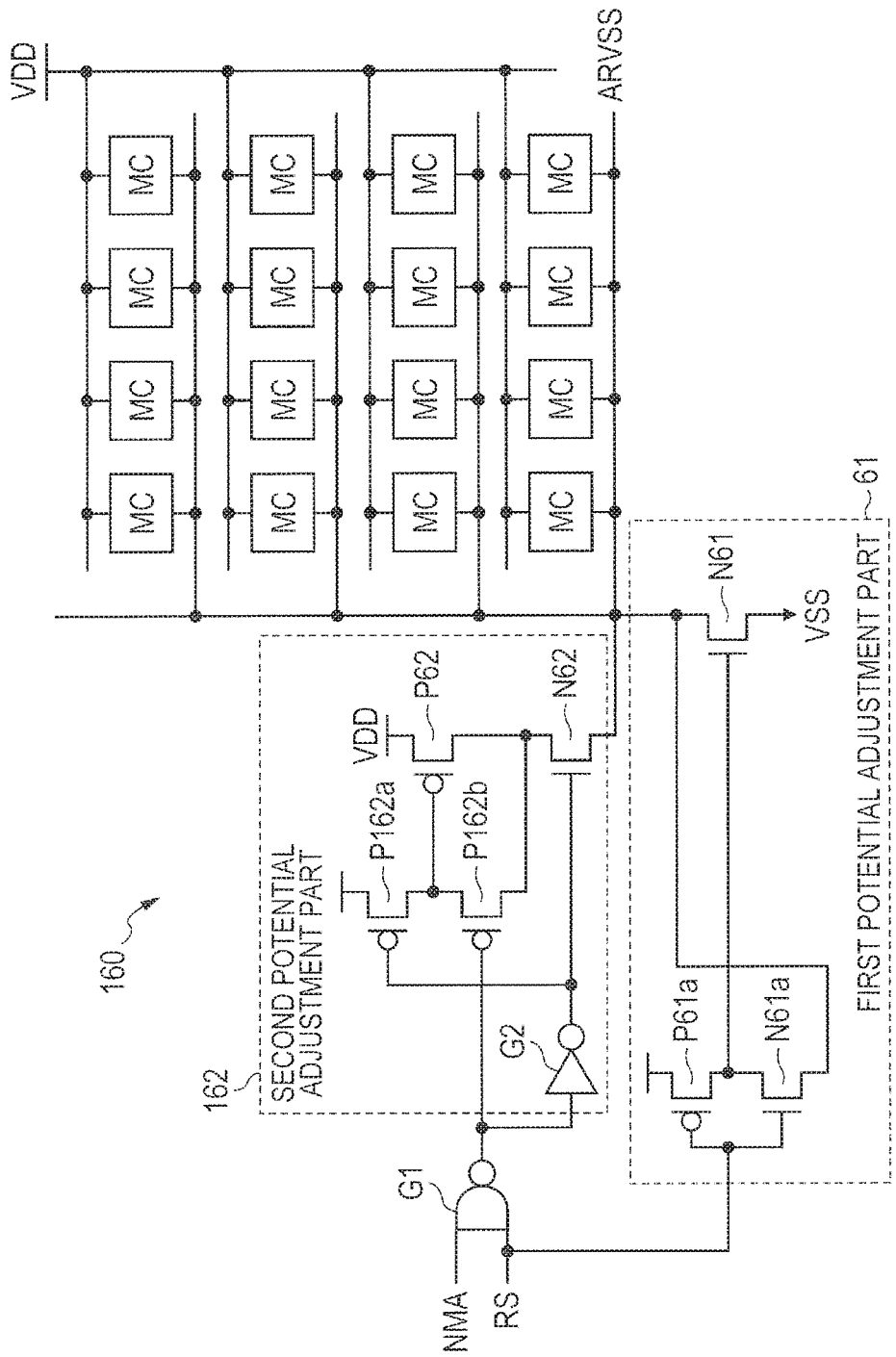
FIG. 5 is a diagram showing an example of the configuration of a memory unit potential controller according to a second embodiment of the present invention.

FIG. 5 is a diagram showing an example of the configuration of a memory unit potential controller according to the second embodiment of the present invention. As shown in FIG. 5, a memory unit potential controller 160 according to the present embodiment includes, for example, a first potential adjustment part 61, a second potential adjustment part 162, a gate circuit G1, and the like. Of these elements, the first potential adjustment part 162 and the gate circuit G1 have the same configuration as the embodiment described above.

As shown in FIG. 5, the second potential adjustment part 162 includes, for example, agate circuit G2 and transistors P62, N62, P162*a*, and P162*b*. Of these elements, for example, the transistor N62 is configured with NMOS, and the transistors P62, P162*a*, and P162 are configured with PNMOS.

One end of the transistor P162*a* and one end of the transistor P162*b* are coupled to each other. Further, one end of the transistor P162*a* and one end of the transistor P162*b* are coupled to the gate of the transistor P62. The other end of the transistor P162*a* is coupled, for example, to the power supply line VDD. Then, the other end of the transistor P162 is coupled to one end of the transistor P62 as well as one end of the transistor N62. The gate of the transistor P162*a* is coupled to the output terminal of the gate circuit G2. In other words, the output terminal of the gate circuit G2 is coupled to the gate of the transistor P162*a* as well as the gate of the transistor N62. The gate of the transistor P162P is coupled to the output terminal of the gate circuit G1.

[Adjustment of the Potential Applied to the Memory Cell]

Next, a description will be given of a method for adjusting the potential applied to the memory cell MC by using the memory unit potential controller 160.

Before the potential adjustment is performed by the memory unit potential controller 160, for example, the signal line RS is set to a low level. At this time, the gate circuit G1 outputs a high level signal and the gate circuit G2 outputs a low level signal. Thus, the low level signal is input to the gate of the transistor P162a, and the high level signal is input to the gate of the transistor P162a. In response to this, only the transistor P162a is switched to the on state, so that the high level signal is input to the gate of transistor P62 from the power supply line VDD through the transistor P162a. Thus, the transistor P62 is switched to the off state and the second current is not supplied through the transistors P62 and N62.

On the other hand, when both the signal lines MNA and RS are set to a high level, the gate circuit G1 outputs a low level signal and the gate circuit G2 outputs a high level signal. Thus, the high level signal is input to the gate of the transistor P162a of the second potential adjustment part 162, and the low level signal is input to the gate of the transistor P162b.

In response to this, the transistor P162 is switched to the off state and the transistor P162b is switched to the on state. Then, the gate of the transistor P62 is coupled to one end of the transistor P62 through the transistor P162b. Thus, the potential of the transistor P62 is set to a value that is approximately equal to the threshold voltage of the transistor P162b and is higher than the potential at one end of the transistor P62. In response to this, the transistor P62 is diode coupled through the transistor P162b. In other words, the transistor P62 is functions as a diode coupled transistor (second diode coupled transistor).

Thus, the transistor P62 supplies the second current between the power supply line VDD and the power supply line ARVSS while reducing the current amount (current value) of the second current, by controlling the gate voltage by using the transistor P162b. As described above, the present embodiment adjusts the potential of the power supply line ARVSS (the first end portion of the memory cell MC), by reducing the current amount of the first current by controlling the gate voltage of the transistor N61 by using the transistor N61a, and by reducing the current amount of the second current by controlling the gate voltage of the transistor P62 by using the transistor P162b.

According to the present embodiment, the following effects can be obtained, in addition to the effects of the embodiment described above. According to the present embodiment, the transistor P62 of the second potential adjustment part 162 functions as a diode coupled transistor through the transistor P162b. According to this configuration, the current value of the second current flowing through the transistor P62 is reduced by the transistor P162b, so that the potential of the power supply line ARVSS can be appropriately adjusted to prevent the potential from being excessively increased. In this way, it is possible to maintain the retention characteristics of the memory cell MC more reliably.

Further, according to the present embodiment, the current value of the second current is adjusted in the transistor 62, and at the same time, the current value of the first current is adjusted in the transistor N6, so that the current amount in the power supply line ARVSS is adjusted more appropriately and the potential of the power supply line ARVSS is adjusted more appropriately. This makes it possible to further reduce the power consumption required to adjust the potential applied to the memory cell.

Third Embodiment

Next, a third embodiment of the present invention will be described. In the present embodiment, a description will be given of the case where a memory unit potential controller stops the supply of the second current when a predetermined current supply time has elapsed after the start of the supply of the second current.

Figure 6:
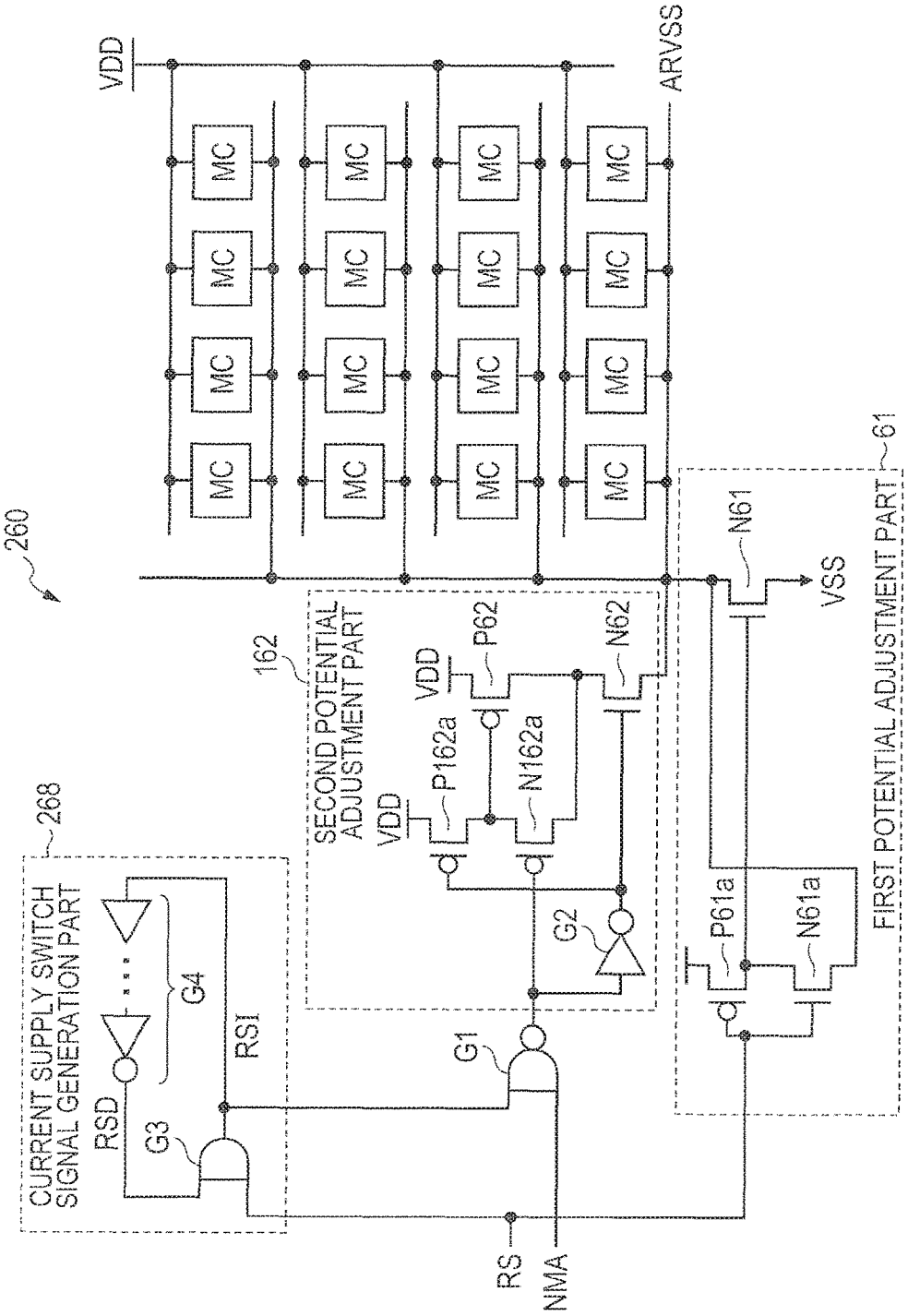
FIG. 6 is a diagram showing an example of the configuration of a memory unit potential controller according to a third embodiment of the present invention.

FIG. 6 is a diagram showing an example of the configuration of a memory unit potential controller according to the third embodiment of the present invention. As shown in FIG. 6, a memory unit potential controller 260 includes, for example, a first potential adjustment part 61, a second potential adjustment part 162, a current supply switch signal generation part 268, a gate circuit G1, and the like. Of these elements, the first potential adjustment part 61 and the second potential adjustment part 162 have the same configuration as the embodiment described above.

As shown in FIG. 6, for example, the current supply switch signal generation part 268 includes gate circuits G3 and G4. For example, the gate circuit G3 is configured with an AND circuit with two inputs. The signal line RS and the output terminal of the gate circuit G4 are respectively coupled to the input terminal of the gate circuit G3. The output terminal of the gate circuit G3 is coupled to the input terminal of the gate circuit G1 as well as the input terminal of the gate circuit G4. The gate circuit G3 generates a current supply switch signal for switching ON and OFF to supply the second current. Then, the gate circuit G3 outputs the generated current supply switch signal to the gate circuits G1 and G4.

For example, the gate circuit G4 is configured in such away that a plurality of inverter circuits are coupled in series. Note that the input terminal of the gate circuit G4 refers to the input terminal of the inverter circuit provided in the first stage, and the output terminal of the gate circuit G4 refers to the output terminal of the inverter circuit provided in the last stage. The gate circuit G4 is configured to output an inverted signal RSD obtained by inverting the current supply switch signal RSI that is input to the input terminal. In other words, when a high potential current supply switch signal RSI is input to the input terminal, the gate circuit G4 outputs a low potential inverted signal RSD from the output terminal. When a low potential current supply switch signal RSI is input to the input terminal, the gate circuit G4 outputs a high potential inverted signal RSD from the output terminal. For this reason, the gate circuit G4 is configured with an odd number of inverter circuits. The gate circuit G4 adjusts the time from when the current supply switch signal RSI is input to when the inverted signal RSD is output, according to the number of inverter circuits. In other words, the gate circuit G4 adjusts the current supply time from when the current supply witch signal RSI for supplying the second current is output until when the current supply switch signal RSI for stopping the supply of the second current is output.

The input terminal of the gate circuit G1 is coupled to the signal line NMA as well as the output terminal of the gate circuit G3. In other words, the current supply switch signal RSI output from the gate circuit G3 is input to the input terminal of the gate circuit G1 coupled to the output terminal of the gate circuit G3.

Note that the current supply switch signal generation part 268 need not necessarily have such a configuration, and may have other configurations as long as they can adjust the current supply time.

[Adjustment of the Potential Applied to the Memory Cell]

Figure 7:
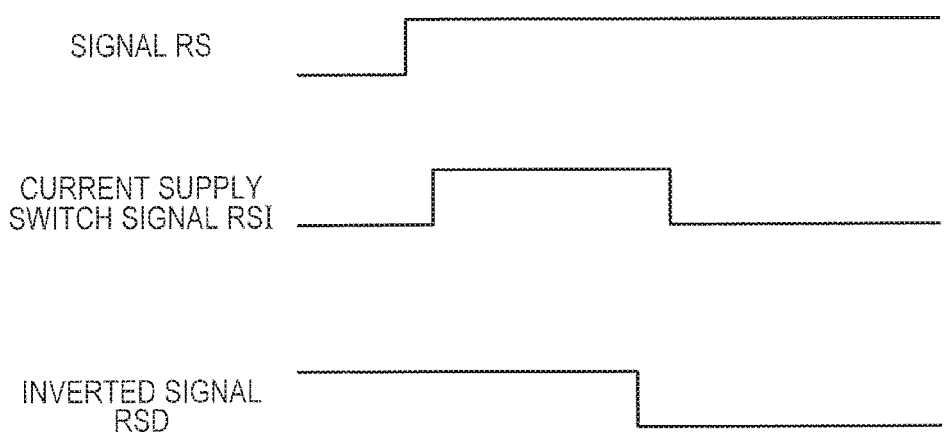
FIG. 7 is a timing chart showing an example of the change with time in the potential of each signal according to the third embodiment of the present invention.

Next, a description will be given of a method for adjusting the potential applied to the memory cell MC by using the memory unit potential controller 260. FIG. 7 is a timing chart showing an example of the change with time in the potential of each signal according to the third embodiment of the present invention. FIG. 7 shows the potentials of the signal line RS, the current supply switch signal RSI, and the inverted signal RSD.

Figure 8:
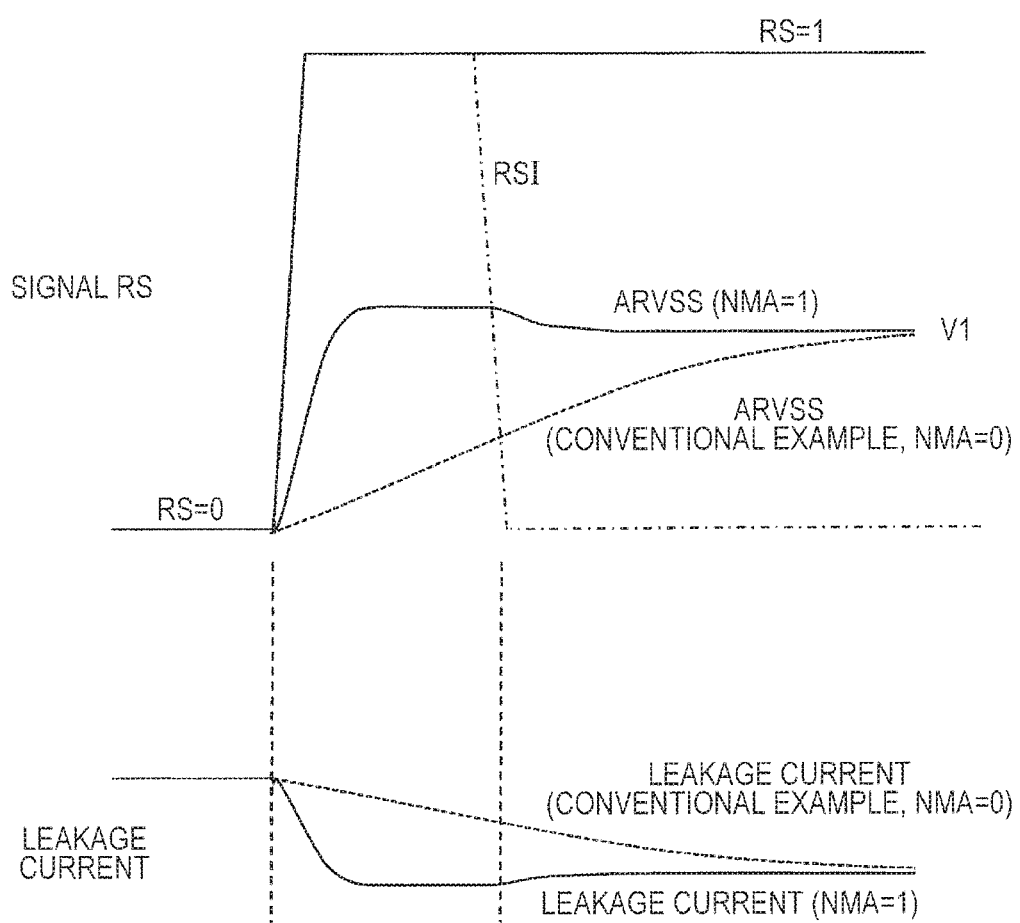
FIG. 8 is a diagram showing the change in potential of a power supply line as well as the change in the leakage current when the potential of the power supply line is adjusted by the memory unit potential controller according to the third embodiment of the present invention.

FIG. 8 is a diagram showing the change in potential of a power supply line as well as the change in the leakage current when the potential of the power supply line is adjusted by the memory unit potential controller according to the third embodiment of the present invention. Note that FIG. 8 shows the change in the potential of the power supply line ARVSS. Further, FIG. 8 also shows the change in the potential of the power supply line ARVSS as well as the change in the leakage current when the potential adjustment according to the present embodiment is not performed.

Before the potential adjustment is performed by the memory unit potential controller 260, for example, the signal line RS is set to low level. At this time, as shown in FIG. 7, the gate circuit G3 of the current supply switch signal generation part 268 outputs a low level current supply switch signal RSI and the gate circuit G4 outputs a high level inverted signal RSD.

On the other hand, in the gate circuit G1, a low level current supply switch signal RSI is input to the input terminal. Then, the gate circuit G1 outputs a high level signal. Then, the low level signal is input to the gate of the transistor P162a of the second potential adjustment part 162, and the high level signal is input to the gate of the transistor P162b. Thus, the transistor P162a is switched to the on state, and the high level signal is input to the gate of the transistor P62. Thus, the transistor P62 is switched to the off state. As a result, the second current is not supplied through the transistors P62 and N62.

When the potential adjustment is performed by the memory unit potential controller 260, both the signals NMA and RS are set to high level. At this time, as shown in FIG. 7, the inverted signal RSD is set to high level. Thus, the high level signal supplied from the signal line RS as well as and the high level inverted signal RSD are respectively input to the input terminals of the gate circuit G3. Then, the gate circuit G3 outputs a high level current supply switch signal RSI.

On the other hand, the high level signal supplied from the signal line RS as well as the high level current supply switch signal RSI are respectively input to the input terminals of the gate circuit G1. Then, the gate circuit G1 outputs a low level signal. In this way, the high level signal is input to the gate of the transistor P162a of the second potential adjustment part 162, and the low level signal is input to the gate of the transistor P162b of the second potential adjustment part 162. Thus, the transistor P162b is switched to the on state, so that the gate of the transistor P62 is coupled to one end of the transistor P62 through the transistor P162b. In this way, the transistor P62 is switched to the on state and functions as a diode coupled transistor. Further, the high level signal is input to the gate of the transistor N62, so that the transistor N62 is switched to the on state. Thus, both the transistors P62 and N62 are switched to the on state, so that the second current is supplied through the transistors P62 and N62. In other words, the high level current supply switch signal RSI serves as a current supply switch signal for supplying the second current.

While at this time in the gate circuit G4, as shown in FIG. 7, a low level inverted signal RSD corresponding to the input high level current supply switch signal RSI is not output and the inverted signal RSD is maintained at high level.

As shown in FIG. 8, the potential of the power supply line ARVSS is rapidly increased to a predetermined potential (for example, V2) and stabilized by supplying the second current. In response to this, as shown in FIG. 8, the leakage current of the memory cell MC (memory cell array) is rapidly reduced.

After that, as shown in FIG. 7, when the gate circuit G4 outputs a low level inverted signal RSD corresponding to the input high level current supply switch signal RSI, the low level inverted signal RSD is input to the input terminal of the gate circuit G3.

In this way, the gate circuit G3 outputs a low level current supply switch signal RSI. Then, the output low level current supply switch signal RSI is input to the gate circuit G1. Thus, the gate circuit G1 outputs a high level signal. In response to this, the transistor P162a is switched to the on state and the transistor P62 is switched to the off state. Further, the transistor N62 is also switched to the off state. In response to this, the supply of the second current through the transistor 62 and N62 is stopped. In other words, the low level current supply switch signal RSI serves as a current supply switch signal for stopping the supply of the second current. In this way, the second potential adjustment part 162 stops the supply of the second current when a predetermined current supply time has elapsed after the start of the supply of the second current.

When the supply of the second current is stopped, as shown in FIG. 8, the potential of the power supply line ARVSS is reduced to a potential (for example, V1) slightly lower than a predetermined potential (for example, V2) and is stabilized. This is because the potential of the power supply line ARVSS is adjusted based on the leakage current of the memory cell MC as well as the first current. Further, in response to this, the leakage current of the memory cell MC (memory cell array) is slightly increased as shown in FIG. 8.

According to the present embodiment, the following effects can be obtained, in addition to the effects of the embodiment described above. According to the present embodiment, the memory unit potential controller 260 stops the supply of the second current when a predetermined current supply time has elapsed after the start of the supply of the second current through the second potential adjustment part 162. According to this configuration, the period for supplying the second current is limited, so that the amount of current supplied to the power supply line ARVSS is further reduced. As a result, the power consumption required for product testing is further reduced. In addition, this makes it possible to use the method for adjusting the potential according to the present embedment also in normal operation.

Further, according to the present embodiment, the current supply switch signal generation part 268 outputs the current supply switch signal for stopping the supply of the second current when a predetermined current supply time has elapsed after outputting the current supply switch signal for supplying the second current. According to this configuration, it is possible to adjust the current supply time by using the current supply switch signal generation part 268.

Further, according to the present embodiment, the gate circuit G4 in which a plurality of inverter circuits are coupled in series is provided in the current supply switch signal generation part 268. According to this configuration, the gate circuit G4 outputs the corresponding inverted signal RSD when a predetermined time has elapsed after the input of the current supply switch signal RSI. Thus, it is possible to easily adjust the current supply time.

Fourth Embodiment

Figure 9:
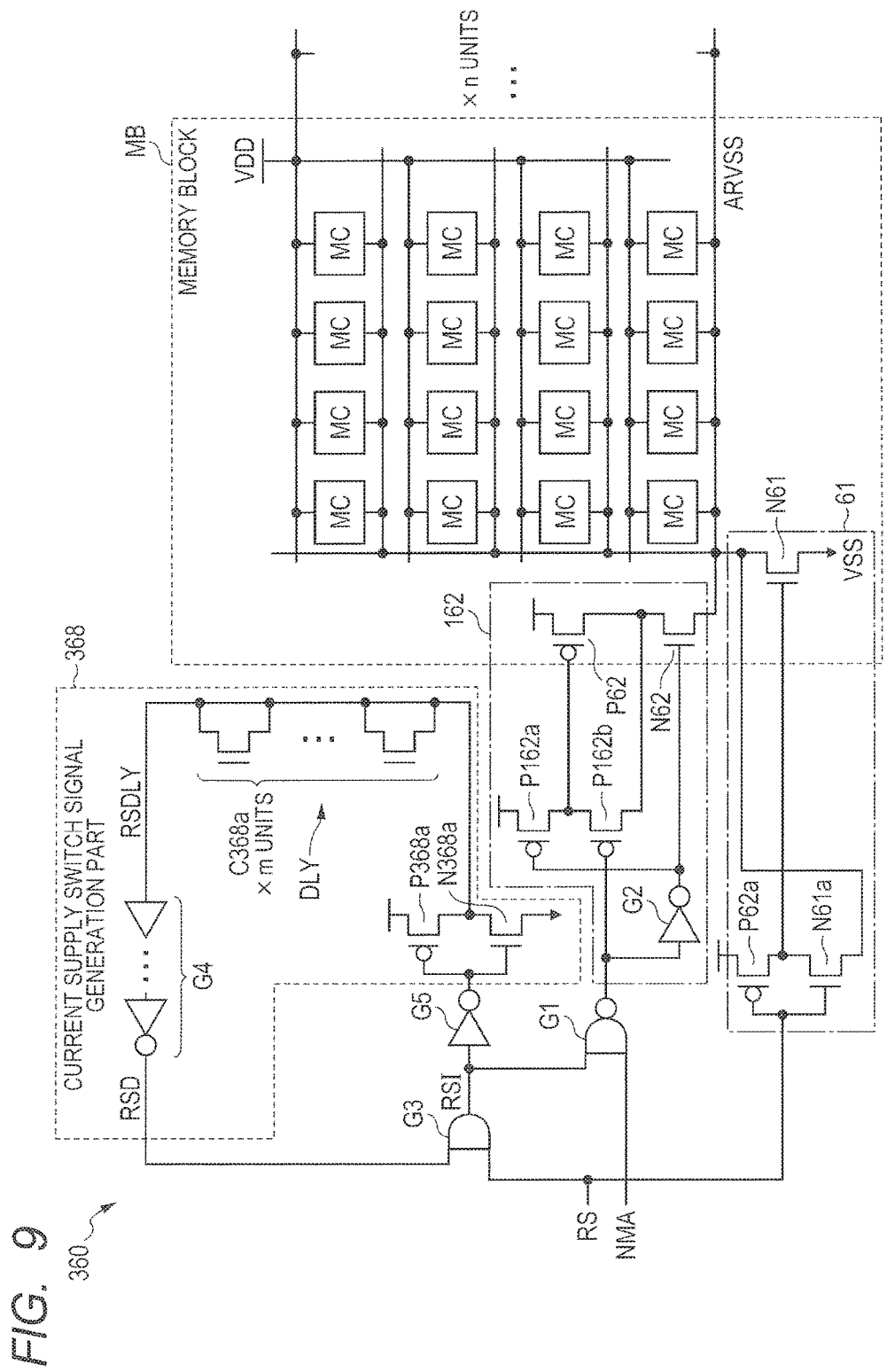
FIG. 9 is a diagram showing an example of the configuration of a memory unit potential controller according to a fourth embodiment of the present invention.

Next, a fourth embodiment of the present invention will be described. The fourth embodiment describes another example of adjusting the current supply time. FIG. 9 is a diagram showing an example of the configuration of a memory unit potential controller according to the fourth embodiment of the present invention. Note that FIG. 9 shows a memory unit potential controller 360 and a plurality of memory cell blocks MB.

As shown in FIG. 9, the memory unit potential controller 360 includes, for example, a first potential adjustment part 61, a second potential adjustment part 162, a current supply switch signal generation part 368, a gate circuit G1, and the like. Of these elements, the first potential adjustment part 61, the second potential adjustment part 162, and the gate circuit G1 have the same configuration as the embodiment described above.

As shown in FIG. 9, for example, the current supply switch signal generation part 368 includes gate circuits G3, G4, and G5, transistors P368a and N368a, a current supply time adjustment part DLY, and the like. For example, the gate circuit G5 is configured with an inverter circuit. The input terminal of the gate circuit G5 is coupled to the output terminal of the gate circuit G3. The output terminal of the gate circuit G5 is coupled to the gate of the transistor P368a as well as the gate of the transistor N368.

One end of the transistor P368a and one end of the transistor N368a are coupled to each other. The other end of the transistor P368a is coupled, for example, to the power supply line VDD. One end of the transistor P368a and one end of the transistor N368a are coupled to the input terminal of the gate circuit G4.

The transistors P368a and N368a respectively configure inverter circuits. Thus, the inverter circuits, which are configured with the transistors P368a and N368a, output a current supply time adjustment signal RSDLY configuring the same logic as the logic of the current supply switch signal RSI output from the gate circuit G3. In other words, the current supply time adjustment signal RSDLY is generated by these circuits based on the current supply switch signal RSI. In this way, it is possible to reduce the occurrence of failure such as logical inversion due to an attenuation of the current supply time adjustment signal RSDLY.

For example, the current supply time adjustment part DLY is configured with a load capacitance C368a or the like. As shown in FIG. 9, the load capacitance C368a is configured with NMOS. The load capacitance C368a can be configured with, for example, PMOS other than NMOS, or can be configured with a pair of facing wiring layers. Further, the load capacitance C368a can be configured with a plurality of divided sections (m units) as shown in FIG. 9, or can be configured with a single capacitance, as long as it meets a predetermined capacitance value. The load capacitance is coupled to a line for coupling the input terminal of the gate circuit G4 and the output terminal of the inverter circuits configured with the transistors P368a and N368a.

For example, the capacitance value of the load capacitance C368a is set based on the number of memory cells MC coupled to the second potential adjustment part 162. The capacitance value of the load capacitance C368a is set in such a way that the second current is supplied during the period until the potential of the power supply line ARVSS is increased to a sufficient potential (for example, V1) after the start of the potential adjustment. More specifically, the capacitance value of the load capacitance C368a is set based on the number of memory cells MC coupled to the transistor N62.

More specifically, the transistor configuring the load capacitance C368a is preferably configured in such a way that the ratio of the drive capability of the transistor P368a that drives the current supply time adjustment signal RSDLY, to the capacitance value of the load capacitance C368a is equivalent to the ratio of the drive capability of the transistor N62 to the parasitic capacitance of the transistors (here, all NMOS transistors) coupled to the power supply line ARVSS.

In FIG. 9, the transistor N62 is provided corresponding to each memory block MB, so that the capacitance value of the load capacitance C368a is set based on the number of memory cells MC provided in the memory block MB. Further, the signal can be delayed also in the gate circuit G4, so that the capacitance value of the load capacitance C368a is preferably set by taking into account the delay time in the gate circuit G4.

The current supply time adjustment part DLY with such a configuration adjusts the current supply time based on the current supply time adjustment signal RSDLY. More specifically, the current supply time adjustment part DLY adjusts the current supply time in such a way that the current supply time adjustment signal RSDLY is delayed by the load capacitance C368a. More specifically, for example, the current supply time adjustment part DLY is set in such a way that the supply of the second current is stopped immediately after the potential of the power supply line ARVSS is increased and stabilized by the potential adjustment.

[Arrangement of the Load Capacitance and the Like]

Next, the arrangement of the load capacitance C368a will be described. FIG. 10 is a layout diagram showing an example of the configuration of the memory unit potential controller according to the fourth embodiment of the present invention. FIG. 10 shows an example of the layout of the first potential adjustment part 61, the transistors P62, N62, P162a, and P162b that configure the second potential adjustment part 162, and the load capacitance 368a of the current supply time adjustment part DLY. Further, FIG. 10 also shows an example of the layout of some of the memory cells MC.

FIG. 10 shows, for example, the layout of a diffusion layer Diff and a gate layer Poly that configure each transistor. Further, FIG. 10 also shows the layout of various power supply lines coupled to the diffusion layer Diff and the gate layer Poly, as well as contact holes Cont for coupling to the lines. Note that the symbol is not added to all contact holes in FIG. 10. The symbol "Cont" is added to only some of the contact holes to the extent that the diffusion layer Diff and the gate layer Poly are not confused with each other.

As described above, the capacitance value of the load capacitance C368a is set based on the number of memory cells MC provided in the memory block MB. Further, as shown in FIG. 10, the memory block MB is arranged along the X-axis direction (first direction). At this time, the load capacitance C368a is preferably arranged along the Y-axis direction (second direction). More specifically, it is preferable that the load capacitance C368a is arranged along the Y-axis direction in the vicinity of a memory block MB at an end on the Y-axis direction side.

For example, when the load capacitance C368a is provided in the vicinity of the leftmost memory block MB on the left side in the figure, the load capacitance C368a is arranged along the Y-axis direction in the vicinity of the leftmost memory block MB on the left side. Further, when the load capacitance C368a is provided in the vicinity of the rightmost memory block MB in the figure, the load capacitance C368a is arranged along the Y-axis direction in the vicinity of the rightmost memory block MB on the right side. With this arrangement of the load capacitance C368a, it is possible to efficiently arrange the load capacitance C368a even if the number of memory blocks is increased.

In addition, even if the number of memory cells MC is increased within the memory block MB and the memory cell array extends in the y direction, additional load capacitances C368a can be arranged sequentially in the Y-axis direction. In this way, the load capacitances C368a can be arranged efficiently.

In the present embodiment, as shown in FIG. 9, the transistor N61 of the first potential adjustment part 61 and the transistors P62, N62 of the second potential adjustment part 162 are provided corresponding to each of the memory blocks MB. Thus, the arrangement of the transistors N61, P62, and N62 will be described.

The transistors N61, P62, and N62 are preferably arranged along the X-axis direction in the vicinity of the corresponding memory block MB on the Y-axis side. For example, the transistors N61, P62, and N62 are provided in the vicinity of the memory block MB on the lower side in the figure and are arranged along the X-axis direction. It may also be possible that the transistors N61, P62, and N62 are provided in the vicinity of the memory block MB on the upper side in the figure and are arranged along the X-axis direction.

In either case, it is preferable that all the transistors N61, P62, and N62 are arranged on the same side with respect to the memory block MB. In other words, all the transistors N61, P62, and N62 are preferably arranged on the lower or upper side of the memory block MB in the figure. With this arrangement, it is possible to efficiently arrange all the transistors N61, P62, and N62. In addition, even if there is a change in the number of memory blocks MB, it is possible to reduce impact on the transistors N61, P62, and N62.

Note that in FIGS. 9 and 10, each of the transistors N61, P62, and N62 is provided in the corresponding memory block MB, but may also be provided outside the memory block MB.

[Adjustment of the Potential Applied to the Memory Cell]

Figure 11:
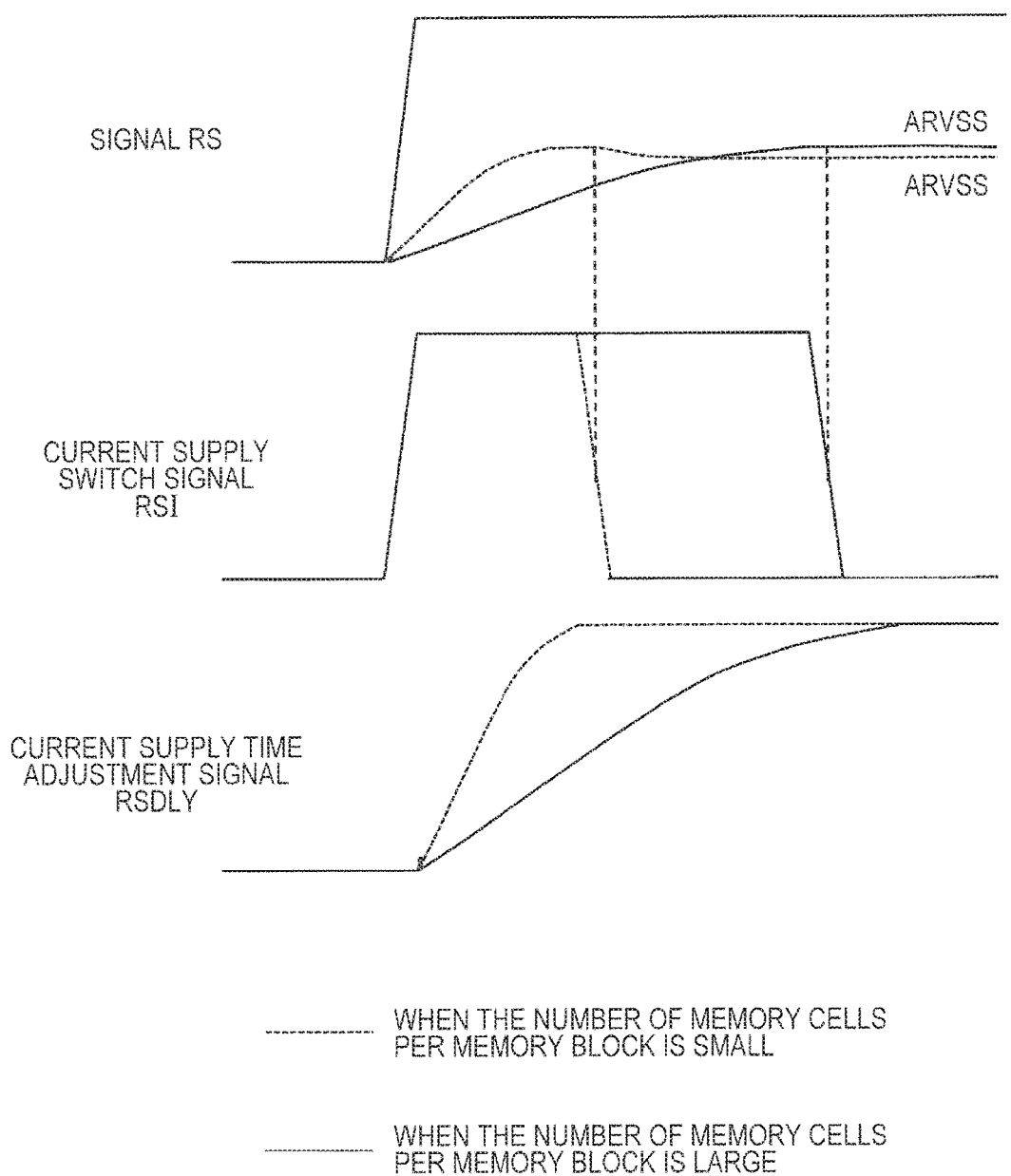
FIG. 11 is a diagram showing the change in potential of a power supply line when the potential is adjusted by the memory unit potential controller according to the fourth embodiment of the present invention.

Next, the method of adjusting the potential applied to the memory cell MC will be described. FIG. 11 is a diagram showing the change in a potential of a power supply line when the potential is adjusted by the memory unit potential controller according to the fourth embodiment. Note that FIG. 11 shows the change in the potential of the power supply line ARVSS. Further, FIG. 11 shows the change in the potential of the power supply line ARVSS according to the number of memory cells MC per memory block MB.

Further, FIG. 11 shows the change in the potential of the current supply switch signal RSI and in the potential of the current supply time adjustment signal RSDLY in accordance with the number of memory cells MC per memory block MB. More specifically, the respective potentials are shown by the dashed line when the number of memory cells MC per memory block MB is small (in other words, when the capacitance value of the load capacitance C368a is small). Further, the respective potentials are shown by the solid line when the number of memory cells MC per memory block MB is large (in other words, when the capacitance value of the load capacitance C368a is large).

When the signal lines NMA and RS are set to high level and the potential adjustment is started by the memory unit potential controller 360, the gate circuit G3 outputs a high level current supply switch signal RSI as shown in FIG. 11. In response to this, the transistors P62 and N62 in the second potential adjustment part 162 are switched to the on state and the supply of the second current is started.

On the other hand, the inverter circuit configured with the transistors P368a and N378a outputs a high level current supply time adjustment signal RSDLY based on the high level current supply switch signal RSI. However, due to the influence of the load capacitance C368a, as shown in FIG. 11, the potential of the current supply time adjustment signal RSLDY is increased more moderately than the current supply switch signal RSI, and reaches the high level in a predetermined amount of time. In this way, the current supply time of the second current is adjusted in the current supply time adjustment part DLY.

The gate circuit G4 outputs a low level inverted signal RSD corresponding to the current supply time adjustment signal RSDLY that has reached the high level. Then, the gate circuit G3 outputs a low level current supply switch signal RSI. In response to this, the transistors P62 and N62 are switched to the off state and the supply of the second current is stopped.

For example, as shown in FIG. 11, when the capacitance value of the load capacitance C368a is small, the potential of the current supply time adjustment signal RSDLY reaches the high level in shorter time than when the capacitance value of the load capacitance C368a is large. For this reason, the current supply time is short when the capacitance value of the load capacitance C358a is small, as compared to when the capacitance value of the load capacitance C368a is large.

Further, as shown in FIG. 11, the potential of the power supply line ARVSS is increased in a short time when the number of memory cells MC per memory block MB is small, as compared to when the number of memory cells MC per memory block MB is large.

Effects of the Present Embodiment

According to the present embodiment, the following effects can be obtained in addition to the effects of the embodiments described above. According to the present embodiment, the current supply time adjustment part DLY adjusts the current supply time of the second current based on the current supply time adjustment signal RSDLY. According to this configuration, the current supply time can be freely adjusted, so that the current supply time can be adjusted appropriately. This makes it possible to prevent the increase of the potential of the power supply line ARVSS when it is stabilized, and to reduce the power consumption required for the potential adjustment.

Further, according to the present embodiment, the current supply time adjustment part DLY is configured with the load capacitance C368a. According to this configuration, the current supply time adjustment part DLY is simplified, so that the current supply time adjustment part DLY can easily be configured.

Further, according to the present embodiment, the load capacitance C368a is configured with PMOS or NMOS. According to this configuration, the load capacitance C368a is formed simultaneously in the production process of other circuit blocks, so that extra cost and time is not required for the formation of the load capacitance C368a.

Further, according to the present embodiment, the capacitance value of the load capacitance C368a is set based on the number of memory cells MC coupled to the transistor N62. According to this configuration, the appropriate current supply time is set based on the number of memory cells MC coupled to the transistor N62. In this way, the power consumption required for setting the potential of the power supply line ARVSS is appropriately adjusted.

Further, according to the present embodiment, the memory unit 20 includes a plurality of memory blocks MB. At the same time, the transistors P62 and N62 are provided corresponding to each of the memory blocks MB. Then, the capacitance value of the load capacitance C368a is set based on the number of memory cells MC provided in the memory block MB.

According to this configuration, the appropriate current supply time is set based on the number of memory cells MC per memory block MB. In this way, the power consumption required for setting the potential of the power supply line ARVSS is appropriately adjusted. In addition, according to this configuration, the second current is supplied on the basis of per memory block MB, so that it is possible to reduce the capacitance value of the load capacitance C368a configuring the current supply time adjustment part DLY. As a result, the chip area of the load capacitance C368a is reduced.

Further, according to the present embodiment, the transistor configuring the load capacitance C368a is configured in such away that the ratio of the drive capability of the transistor P368a that drives the current supply time adjustment signal RSDLY, to the capacitance value of the load capacitance C378a is equivalent to the ratio of the drive capability of the transistor N62 to the parasitic capacitance of the transistor coupled to the power supply line ARVSS.

According to this configuration, the current supply switch signal RSI can be switched in an appropriate timing, even if a change occurs in the conditions of the memory cell array, such as number of rows, number of columns, potential, and temperature, or even if fluctuations occur in the threshold voltage of the transistor varies in the manufacturing process. In this way, the current supply time can be adjusted appropriately.

Further, according to the present embodiment, a plurality of memory blocks MB are arranged along the X-axis direction. Then, the load capacitance C368a is arranged along the Y-axis direction in the vicinity of a memory block MB at an end on the X-axis direction side. According to this configuration, even if the number of memory blocks MB is increased, the load capacitance 368a can be arranged efficiently. Further, even if the number of memory cells MC is increased within the memory block MB, the additional load capacities C368a can be arranged sequentially in the Y-axis direction, so that the load capacitances C368a can be arranged efficiently.

Further, according to the present embodiment, the transistors N61, P62, and N62 are arranged along the X-axis direction in the vicinity of the corresponding memory block MB on the Y-axis direction side. According to this configuration, the transistors N61, P62, and N62 can be arranged efficiently. Further, even if there is a change in the number of memory blocks MB, it is possible to reduce impact on the transistors N61, P62, and N62.

Fifth Embodiment

Next, a fifth embodiment of the present invention will be described. In the embodiments described above, only the potential of the power supply line ARVSS on the low potential side is adjusted. However, the present embodiment describes the case where the potential on the high potential side is also adjusted.

Figure 12:
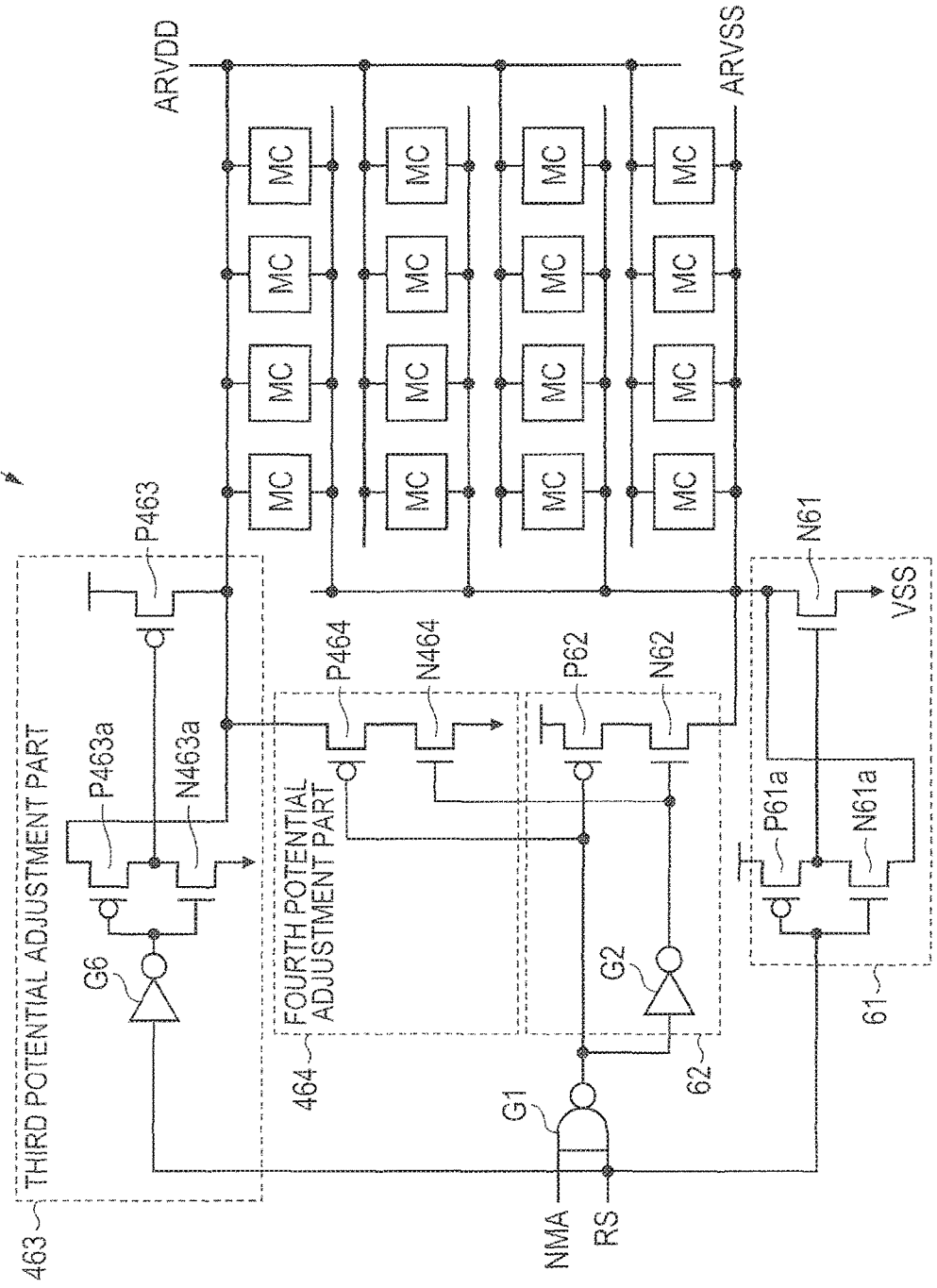
FIG. 12 is a diagram showing an example of the configuration of a memory unit potential controller according to a fifth embodiment of the present invention.

FIG. 12 is a diagram showing an example of the configuration of a memory unit potential controller according to the fifth embodiment of the present invention. Note that FIG. 12 shows a memory unit potential controller 460 and a plurality of memory cells MC.

In the embodiments described above, the high potential side of the memory cell MC is coupled to the power supply line VDD. However, in the present embodiment, the end (second end) on the high potential side of the memory cell MC is coupled to the power supply line ARVDD as shown in FIG. 12. The power supply line ARVDD is coupled to the power supply line VDD through a transistor P463 described below.

As shown in FIG. 12, the memory unit potential controller 460 includes a first potential adjustment part 61, a second potential adjustment part 62, a third potential adjustment part 463, a fourth potential adjustment part 464, a gate circuit G1, and the like.

As shown in FIG. 12, the third potential adjustment part 463 includes transistors P463, P463a, N463a, and a gate circuit G6. Of these elements, for example, the transistor N463a is configured with NMOS while the transistors P463 and P463a are configured with PMOS.

For example, the gate circuit G6 is configured with an inverter circuit. The input terminal of the gate circuit G6 is coupled to the signal line RS. The output terminal of the gate circuit G6 is coupled to the transistors P463a and N463a.

One end of the transistor P463a and one end of the transistor N463a are coupled to each other. The other end of the transistor P463a is coupled to the power supply line ARVDD, and the other end of the transistor N463a is coupled, for example, to the power supply line VSS. The gate of the transistors P463a and N463a is coupled to the output terminal of the gate circuit G6. One end of the transistors P463a and N463 is coupled to the gate of the transistor P463.

One end of the transistor P463 is coupled to the power supply line VDD (second source), and the other end is coupled to the power supply line ARVDD (the second end portion of the memory cell MC). In other words, the other end of the transistor P463 is coupled to the second end portion of the memory cell MC as well as the other end of the transistor P463a. The transistor P463 is a transistor that supplies a third current between the power supply line VDD and the power supply line ARVDD.

As shown in FIG. 12, for example, the fourth potential adjustment part 464 includes transistors P464 and N464. Of the transistors, the transistor N464 is configured with NMOS and the transistor P464 is configured with PMOS.

One end of the transistor P464 and one end of the transistor N464 are coupled to each other. The other end of the transistor N464 is coupled to the power supply line VSS (first source), and the other end of the transistor P464 is coupled to the power supply line ARVDD. The gate of the transistor P464 is coupled to the output terminal of the gate circuit G1. The gate of the transistor N464 is coupled to the output terminal of the gate circuit G2 of the second potential adjustment part 62. The transistors P464 and N464 are transistors that supply a fourth current between the power supply line VSS and the power supply line ARVDD.

[Adjustment of the Potential Applied to the Memory Cell]

Next, a description will be given of a method for adjusting the potential applied to the memory cell MC by using the memory unit potential controller 460. Note that the potential adjustment of the power supply line ARVDD will mainly be described below, and the potential adjustment of the power supply line ARVSS will also be described as needed.

Figure 13:
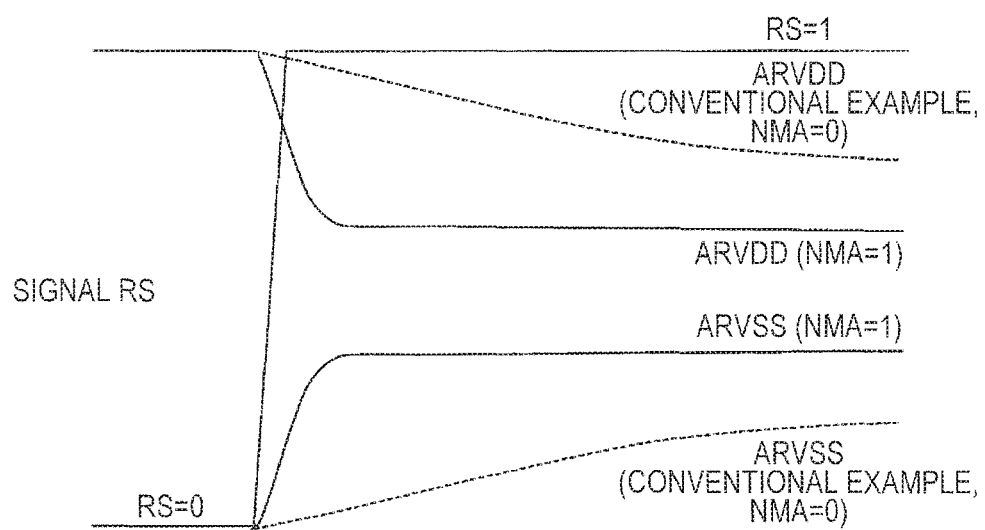
FIG. 13 is a diagram showing the change in potential of power supply lines when the potential is adjusted by the memory unit potential controller according to the fifth embodiment of the present invention.

FIG. 13 is a diagram showing the change in potential of power supply lines when the potential is adjusted by the memory unit potential controller according to the fifth embodiment of the present invention. Note that FIG. 13 shows the change in the potential of the power supply lines ARVSS and ARVDD. In addition, FIG. 13 also shows the change in the potential when the potential adjustment according to the present embodiment is not performed.

When the potential of the signal line NMA and the potential of the signal line RS are both set to high level, the adjustment of the potential is performed by the memory unit potential controller 460. When a high level signal is input to the two input terminals of the gate circuit G1, a low level signal is output from the output terminal of the gate circuit G1.

In the fourth potential adjustment part 464, a low level signal is input to the gate of the transistor P464, and at the same time, a high level signal is input to the gate of the transistor N464. Thus, both the transistors P464 and N464 are switched to the on state. Then, the transistors P464 and N464 allow the fourth current to flow between the power supply line VDD and the power supply line ARVSS. Note that the power supply line VSS is coupled to the low potential power supply, so that the potential of the power supply line VSS is lower than the potential of the power supply line ARVDD. Thus, the fourth current flows from the power supply line ARVDD to the power supply line VSS.

Next, in the third potential adjustment part 463, the transistor N463a is switched to the off state and the transistor P463a is switched to the on state. Then, the gate of the transistor P463 is coupled to the other end (power supply line ARVDD) of the transistor P463 through the transistor P463a. Thus, the potential of the transistor P463 is set to a value that is approximately equal to the threshold voltage of the transistor P463a and is lower than the potential of the power supply line ARVDD. In this way, the transistor P463 is diode coupled through the transistor P463a. In other words, the transistor P463 functions as a diode coupled transistor.

Thus, the transistor P463 allows the third current to flow between the power supply line VDD and the power supply line ARVDD while reducing the current amount (current value) of the third current by controlling the gate voltage by the transistor P463a. Note that the power supply line VDD is coupled to the high potential power supply, so that the potential of the power supply line VDD is higher than the potential of the power supply line ARVDD. Thus, the third current flows from the power supply line VDD to the power supply line ARVDD.

In this way, the third current flows into the power supply line ARVDD through the third potential adjustment part 463. At the same time, the leakage current of the memory cell flows from the power supply line ARVDD, and the fourth current flows from the memory cell through the fourth potential adjustment part 464. The memory unit potential controller 460 adjusts the potential of the power supply line ARVDD (the second end portion of the memory cell MC) based on these currents. Note that the memory unit potential controller 460 performs not only the potential adjustment of the power supply line ARVDD but also the potential adjustment of the power supply line ARVSS.

When the potential adjustment is performed by the memory unit potential controller 460, as shown in FIG. 13, the potential of the power supply line ARVDD is rapidly reduced to a predetermined potential and is stabilized at this level.

According to the present embodiment, the following effects can be obtained in addition to the effects of the embodiments described above. According to the present embodiment, the memory unit potential controller 460 adjusts the potential of the power supply line ARVDD based on the third current supplied through the third potential adjustment part 463, the fourth current supplied through the fourth potential adjustment part 464, and the leakage current.

According to this configuration, the fourth current flows out of the power supply line ARVDD, so that the potential of the power supply line ARVDD can be rapidly reduced and stabilized at the reduced level. In this way, the potential of the power supply line ARVDD can be set to a predetermine potential in a short time, so that the product testing time is reduced also in the power supply line ARVDD.

Sixth Embodiment

Figure 14:
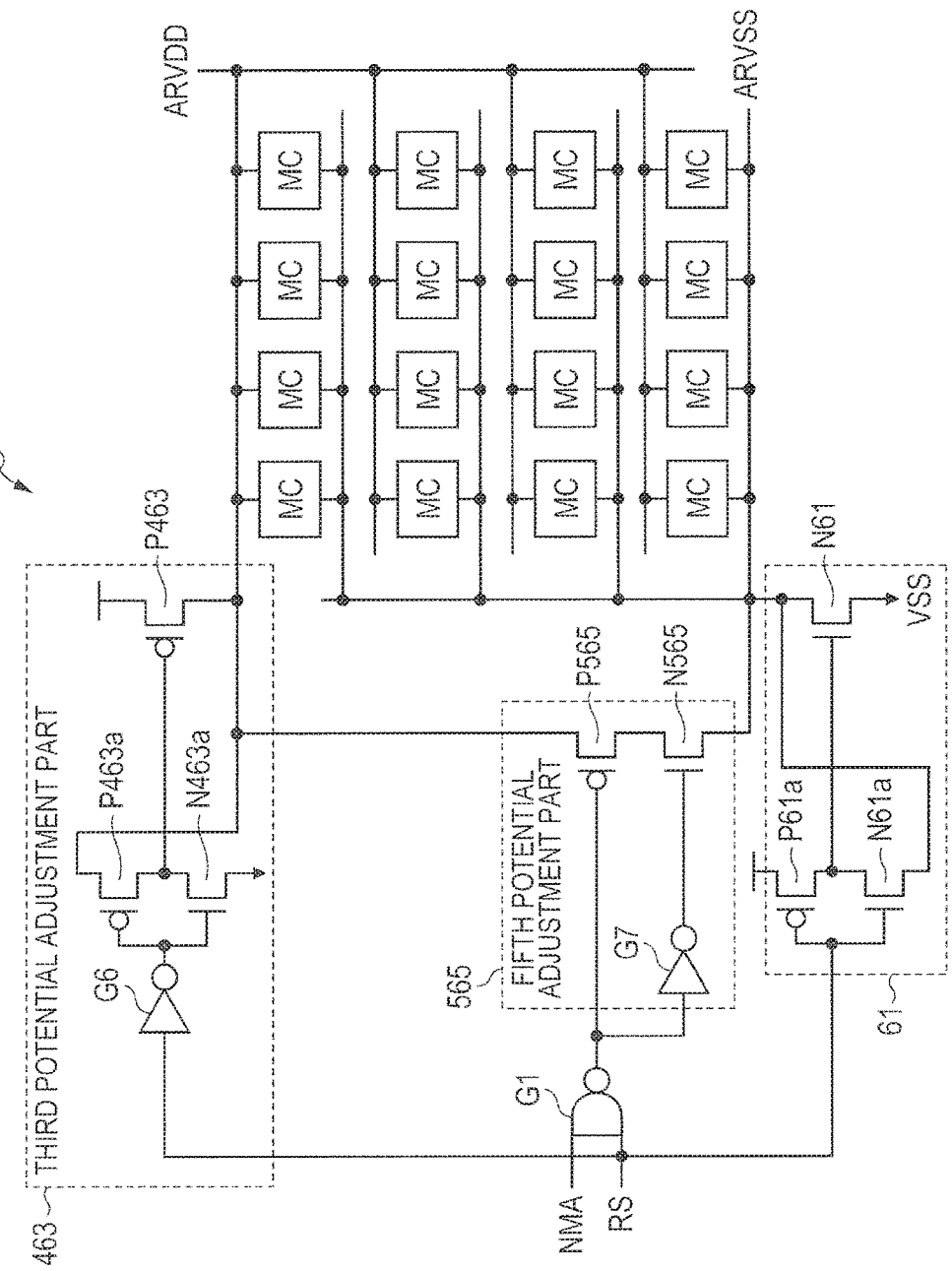
FIG. 14 is a diagram showing an example of the configuration of a memory unit potential controller according to a sixth embodiment of the present invention.

Next, a sixth embodiment of the present invention will be described. The present embodiment describes the case where the power supply line ARVSS and the power supply line ARVDD are coupled to each other through a potential adjustment part. FIG. 14 is a diagram showing an example of the configuration of a memory unit potential controller according to the sixth embodiment of the present invention. Note that a memory unit potential controller 560 and a plurality of memory cells MC are shown in FIG. 14.

As shown in FIG. 14, the memory unit potential controller 560 includes a first potential adjustment part 61, a third potential adjustment part 463, a fifth potential adjustment part 565, a gate circuit G1, and the like.

As shown in FIG. 14, for example, the fifth potential adjustment part 565 includes a gate circuit G7 as well as transistors P565 and N567. Of these transistors, for example, the transistor N565 is configured with NMOS and the transistor P565 is configured with PMOS.

One end of the transistor P565 and one end of the transistor N565 are coupled to each other. The other end of the transistor P565 is coupled to the power supply line ARVDD (the second end portion of the memory cell MC), and the other end of the transistor N565 is coupled to the power supply line ARVSS (the first end portion of the memory cell MC). The gate of the transistor P565 is coupled to the output terminal of the gate circuit G1. The gate of the transistor N62 is coupled to the output terminal of the gate circuit G7. The transistors P565 and N565 are transistors that supply a fifth current between the power supply line ARVDD and the power supply line ARVSS.

For example, the gate circuit G7 is configured with an inverter circuit. The input terminal of the gate circuit G7 is coupled to the output terminal of the gate circuit G1. Then, the output terminal of the gate circuit G7 is coupled to the gate of the transistor N565.

[Adjustment of the Potential Applied to the Memory Cell]

Figure 15:
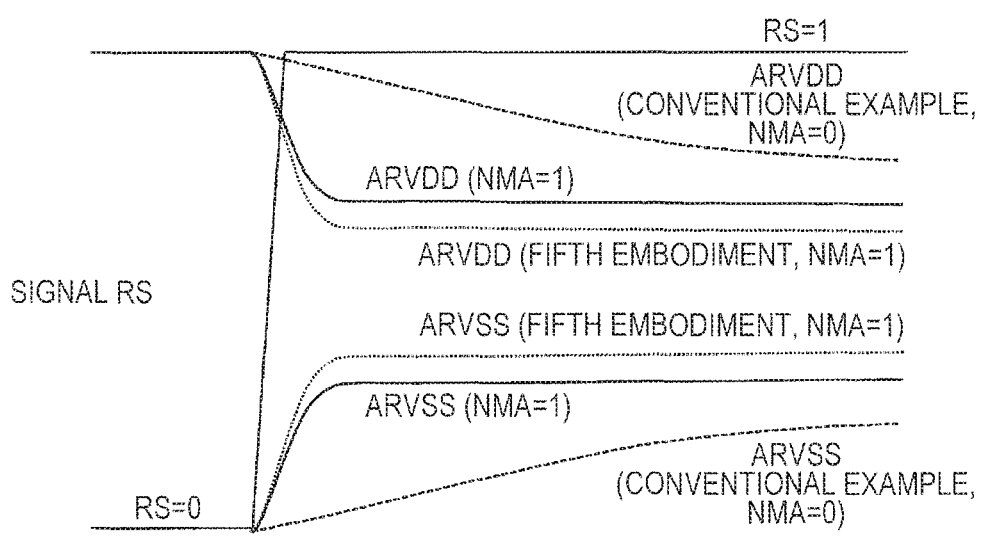
FIG. 15 is a diagram showing the change in potential of power supply lines when the potential is adjusted by the memory unit potential controller according to the sixth embodiment of the present invention.

Next, a description will be given of a method for adjusting the potential applied to the memory cell MC. FIG. 15 is a diagram showing the change in potential of power supply lines when the potential is adjusted by the memory unit potential controller according to the sixth embodiment of the present invention. Note that FIG. 15 shows the change in the potential of the power supply lines ARVSS and ARVDD. In addition, FIG. 15 also shows the change in the potential of the power supply lines ARVSS and ARVDD when the potential adjustment according to the present embodiment is not performed, as well as the change in the potential of the power supply lines ARVSS and ARVDD in the fifth embodiment described above.

When the signal lines NMA and RS are both set to high level, the potential adjustment is performed by the memory unit potential controller 460. When a high level signal is input to the two input terminals of the gate circuit G1, a low level signal is output from the output terminal of the gate circuit G1.

In the fifth potential adjustment part 565, a low level signal is input to the gate of the transistor P565, and at the same time, a high level signal is input to the gate of the transistor N565. Thus, the transistors P565 and N565 are switched to the on state. Then, the transistors P565 and N565 allow the fifth current to flow between the power supply line ARVDD and the power supply line ARVSS. Note that the potential of the power supply line ARVDD is higher than the potential of the power supply line ARVSS. Thus, the fifth current flows from the power supply line ARVDD to the power supply line ARVSS.

In this way, the fifth current flows into the power supply line ARVSS through the fifth potential adjustment part 565, and at the same time, the leakage current of the memory cell MC flows into the power supply line ARVSS. On the other hand, the first current flows out of the power supply line ARVSS through the first potential adjustment part 61. The memory unit potential controller 560 adjusts the potential of the power supply line ARVSS (the first end portion of the memory cell MC) based on these currents.

The third current flows into the power supply line ARVDD through the third potential adjustment part 463. On the other hand, the leakage current of the memory cell MC flows out of the power supply line ARVDD, and at the same time, the fifth current flows out of the power supply line ARVDD through the fifth potential adjustment part 565. The memory unit potential controller 560 adjusts the potential of the power supply line ARVDD (the second end portion of the memory cell MC) based on these currents.

When the potential adjustment is performed by the memory unit potential controller 560, as shown in FIG. 15, the potential of the power supply line ARVSS is rapidly increased to a predetermined potential and is stabilized at this level, while the potential of the power supply line ARVDD is rapidly reduced to a predetermined potential and is stabilized at this level. However, in the present embodiment, the power supply line ARVSS and the power supply line ARVDD are coupled to each other through the transistors N565 and P565. Thus, as shown in FIG. 15, the potential of the power supply line ARVSS is increased moderately as well as the potential of the power supply line ARVDD is reduced moderately, as compared to the fifth embodiment. For example, the potential difference between the power supply lines ARVSS and ARVDD should be approximately equal to the total voltage of the threshold voltages of the transistors N565 and P565.

According to the present embodiment, the following effects can be obtained in addition to the effects of the embodiments described above. According to the present embodiment, the memory unit potential controller 560 allows the fifth current to flow between the power supply line ARVSS and the power supply line ARVDD through the transistors N565 and P565 that configure the fifth potential adjustment part 565.

According to this configuration, it is possible to allocate the potential difference between the power supply line ARVSS and the power supply line ARVDD, so that the potential adjustment of the power supply lines ARVSS and ARVDD can be performed while maintaining the data retention characteristics of the memory cell MC. In addition, the leakage current can be further reduced.

Seventh Embodiment

Next, a seventh embodiment of the present invention will be described. In the embodiments described above, the potential of the power supply line ARVSS is adjusted by supplying the current originating from the power supply line VDD by using the memory unit potential controller. These configurations enable to reduce the test time even in the case where the leakage current is small, for example, at low temperature or room temperature.

However, when assuming only test performed at high temperature with large leakage current, the test time can be reduced without necessarily including these configurations. In this case, for example, the potential of the power supply line ARVSS can be adjusted by only the current supplied between the power supply line ARVSS and the first source. Thus, the present embodiment describes the case of adjusting the potential of the power supply line ARVSS by only the current supplied between the power supply line ARVSS and the first source.

FIG. 16 is a diagram showing an example of the configuration of a memory unit potential controller according to the seventh embodiment of the present invention. Note that FIG. 16 shows a memory unit potential controller 660 and a plurality of memory cells MC.

As shown in FIG. 16, the memory unit potential controller 660 includes a first potential adjustment part 61, a sixth potential adjustment part 666, gate circuits G8 and G9, and the like.

As shown in FIG. 16, for example, the sixth potential control part 666 includes transistors N666, P666a, N666a, and N666b. Of these transistors, for example, the transistors N666, N666a, and N666b are configured with NMOS, and the transistor P666a is configured with PMOS.

One end of the transistor P666a and one end of the transistor N666a are coupled to each other. The other end of the transistor P666a is coupled to the power supply line VDD, and the other end of the transistor N666a is coupled to the power supply line ARVSS. The gate of the transistor P666a is coupled to the signal line RS. The gate of the transistor N666a is coupled to the output terminal of the gate circuit G8. One end of the transistors P666a and N666a is coupled to the gate of the transistor N666 as well as one end of the transistor N666b.

The other end of the transistor N666b is coupled to the power supply line VSS. The gate of the transistor N666b is coupled to the output terminal of the gate circuit G9.

One end of the transistor N666 is coupled to the power supply line VSS (the first source). Then, the other end of the transistor N666 is coupled to the power supply line ARVSS (the first end portion of the memory cell MC). The transistor N666 is a transistor that supplies a sixth current between the power supply line VSS and the power supply line ARVSS.

The gate circuit G8 is configured with a logic circuit with two inputs. The gate circuit G8 is a logic circuit that outputs a high level signal when a low level signal is input to one input terminal and a high level signal is input to the other input terminal. For example, the signal line NMA is coupled to one end portion of the gate circuit G8, and for example, the signal line RS is coupled to the other end portion of the gate circuit G8. The output terminal of the gate circuit G8 is coupled to the gate of the transistor N666a.

For example, the gate circuit G9 is configured with an AND circuit with two inputs. The signal lines NMA and RS are coupled to the input terminal of the gate circuit G9. The output terminal of the gate circuit G9 is coupled to the gate of the transistor N666b.

[Adjustment of the Potential Applied to the Memory Cell]

Next, a description will be given of a method for adjusting the potential applied to the memory cell MC by using the memory unit potential controller 660. Note that the potential adjustment using the memory unit potential controller 660 is performed, for example, mainly in product testing at high temperature.

<<First State>>

When the signal lines NMA and RS are both set to high level, the gate circuit G8 outputs a low level signal. Further, the gate circuit G9 outputs a high level signal. At this time, a low level signal is input to the gate of the transistor N666a of the sixth potential adjustment part 666. Further, a high level signal is input to the gate of the transistor P666a. Thus, the transistors P666a and N666a are both switched to the off state. Further, a high level signal is input to the gate of the transistor N666b, so that the transistor N666b is switched to the on state. In response to this, the low level signal is input to the gate of the transistor N666 through the transistor N666b, so that the transistor N666 is switched to the off state. Thus, the supply of the sixth current is not performed through the transistor N666.

On the other hand, a high level signal is input to the gate of the transistor P61a of the first potential adjustment part 61 as well as the gate of the transistor N61a. Thus, the transistor P61a is switched to the off state and the transistor N61a is switched to the on state. In response to this, the other end (the power supply line ARVSS) of the transistor N61 is coupled to the gate of the transistor N61 through the transistor N61a. In other words, the transistor N61 is diode coupled through the transistor N61a.

Thus, when the signal lines NMA and RS are both set to high level, the first current is supplied to the power supply line ARVSS through the first potential adjustment part 61. On the other hand, the supply of the sixth current through the sixth potential adjustment part 666 is stopped. Thus, the memory unit potential controller 660 adjusts the potential of the power supply line ARVSS based on the first current and the leakage current. This state will be hereinafter referred to as the first state. The current supplied between the power supply line VSS and the power supply line ARVSS is the smallest in the first state. The test performed in the first state is referred to, for example, as "StandbyMode Test".

<<Second State>>

Next, a description will be given of the case where the signal line NMA is set to low level and the signal line RS is set to high level. In this case, the gate circuit G8 outputs a high level signal. Further, the gate circuit G9 outputs a low level signal. At this time, the high level signal is input to the gate of the transistor N666a. Further, the high level signal is input to the gate of the transistor P666a. Thus, the transistor P666a is switched to the off state and the transistor N666a is switched to the on state. Further, the low level signal is input to the gate of the transistor N666b, so that the transistor N666b is switched to the off state. In response to this, the other end (the power supply line ARVSS) of the transistor N666 is coupled to the gate of the transistor N666 through the transistor N666a. In other words, the transistor N666 is diode coupled through the transistor N666a.

Note that since the potential of the signal line RS is set to high level, the operation of the first potential adjustment part 61 is the same as the first state.

Thus, when the signal NMA is set to low level and the signal RS is set to high level, the first current is supplied to the power supply line ARVSS through the first potential adjustment part 61. At the same time, the sixth current is supplied to the power supply ARVSS through the sixth power adjustment part 666. However, since the transistor N666 of the sixth potential adjustment part 666 is diode coupled, the current value of the sixth current is reduced. Thus, the memory part potential control part 660 adjusts the potential of the power supply ARVSS based on the first current, the sixth current, and the leakage current. This state will be hereinafter referred to as the second state. In the second state, the current supplied between the power supply line VSS and the power supply line ARVSS is larger than the first state. The test performed in the second state is referred to, for example, as "StandbyMode".

<<Third State>>

Next, a description will be given of the case where the signal line NMA is set to low level and the signal line RS is set to low level. In this case, the gate circuit G8 outputs a low level signal. Further, the gate circuit G9 outputs a low level signal. At this time, the low level signal is input to the gate of the transistors N666a and P666a. Thus, the transistor P666a is switched to the on state and the transistor N666a is switched to the off state. Further, the low level signal is input to the gate of the transistor N666b, so that the transistor N666b is switched to the off state. In response to this, a high level signal is input to the gate of the transistor N666. Thus, the transistor N666 is switched to the on state. However, since the transistor N666a is in the off state, the transistor N666 is not diode coupled like the second state.

On the other hand, the low level signal is input to the gate of the transistor P61a of the first potential adjustment part 61 as well as the gate of the transistor N61a. Thus, the transistor P61a is switched to the on state and the transistor N61a is switched to the off state. In response to this, a high level signal is input to the gate of the transistor N61. Thus, the transistor N61 is switched to the on state. However, since the transistor N61a is in the off state, the transistor N61 is not diode coupled like the first state and the second state.

Thus, when the signal lines NMA and RS are both set to low level, the first current is supplied to the power supply line ARVSS through the first potential adjustment part 61. At the same time, the sixth current is supplied to the power supply line ARVSS through the sixth potential adjustment part 666. However, both the transistor N61 of the first potential adjustment part 61 and the transistor N666 of the sixth potential adjustment part 666 are not diode coupled but are normally coupled, so that the current values of the first current and the sixth current are not limited. Thus, the memory unit potential controller 660 adjusts the power supply line ARVSS based on the first current, the sixth current, and the leakage current.

This state will be hereinafter referred to as the third state. In the third state, the current supplied between the power supply line VSS and the power supply line ARVSS is larger than the second state. In other words, the current flowing between the power supply line VSS and the power supply line ARVSS in the third state is the largest of the three states. In the third state, for example, data write "Write" and data read "Read" are performed with respect to the memory cell MC in testing.

The time required for potential adjustment until the potential of the power supply line ARVSS is increased and stabilized is the longest in the first state, followed by the second state and the third state, in this order. In product testing, the time required for potential adjustment can be changed accordingly by switching the potential of the signal lines NMA and RS according to the items to be tested.

According to the present embodiment, the potential of the power supply line VSS is adjusted by supplying the current between the power supply line VSS and the power supply line ARVSS, through the first potential adjustment part 61 and the sixth potential adjustment part 666. According to this configuration, the potential of the power supply line ARVSS can be freely adjusted only by means of the current supplied between the power supply line (first source) VSS and the power supply line ARVSS. In this way, the power supply line ARVSS can be set to an appropriate potential.

Further, the effective length of the channel width of the diode coupled transistor N61 is slightly reduced and the potential of the power supply line ARVSS is increased. This makes it possible to increase the current value of the first current, so that the potential of the power supply line ARVSS can be set to a predetermined potential higher than the power supply line VSS in a shorter time. In addition, this makes it possible to further reduce the test time.

Further, the semiconductor device according to the present embodiment is mainly used for testing at high temperature. The leakage current is larger than at low temperature and at room temperature, so that it is possible to adjust the potential of the power supply line ARVSS by using only the first potential adjustment part 61 and the sixth potential adjustment part 666.

Other Embodiments

In addition to the embodiments described above, the semiconductor device of the present invention may include the following configuration. For example, the memory unit potential controller may be configured with the third potential adjustment part 463, the fourth potential adjustment part 464, the gate circuits G1 and G2, and the like, to adjust only the potential of the power supply line ARVDD.

While the invention made by the present inventors has been concretely described based on exemplary embodiments, the present invention is not limited to the specific exemplary embodiments. It is apparent to those skilled in the art that various modifications and variations can be made without departing from the scope of the present invention.

What is claimed is:

1. A semiconductor device comprising:
    a memory unit comprising a memory cell driven by a voltage applied from a first source and a second source; and
    a memory unit potential controller for adjusting the potential of the voltage applied to the memory cell,
    wherein the memory unit potential controller comprises a first potential adjustment part and a second potential adjustment part,
    wherein the memory unit potential controller supplies a first current between the first source and a first end portion of the memory cell through the first potential adjustment part,
    wherein the memory unit potential controller supplies a second current between the second source and the first end portion of the memory cell through the second potential adjustment part, and
    wherein the memory unit potential controller adjusts the potential of the first end portion of the memory cell based on the first current, the second current, and the leakage current flowing between the first end portion and second end portion of the memory cell.

2. The semiconductor device according to claim 1, wherein the second potential adjustment part is configured to supply the second current whose current value is greater than the leakage current of the memory cell.

3. The semiconductor device according to claim 2, wherein the second potential adjustment part is coupled to the first end portion of a plurality of the memory cells, wherein the second potential adjustment part is configured to supply the second current that is greater than the sum of leakage currents of the memory cells.

4. The semiconductor device according to claim 1, wherein the first potential adjustment part is configured in such a way that the current supply capability is higher than the second potential adjustment part.

5. The semiconductor device according to claim 4, wherein the first potential adjustment part is configured with MOSFET (Metal Oxide Semiconductor Field Effect Transistor) and has a transistor that allows the first current to flow,
    wherein the second potential adjustment part is configured with MOSFET and has a transistor that allows the second current to flow, and
    wherein the transistor of the first potential adjustment part, as well as the transistor of the second potential adjustment part are configured in such a way that the ratio of the channel width to the channel length of the transistor of the first potential adjustment part is larger than the ratio of the channel width to the channel length of the transistor of the second potential adjustment part.

6. The semiconductor device according to claim 1, wherein the first potential adjustment part comprises a first diode coupled transistor, and
    wherein the first potential adjustment part is configured to supply the first current through the first diode coupled transistor.

7. The semiconductor device according to claim 1, wherein the second potential adjustment part comprises a second diode coupled transistor, and
    wherein the second potential adjustment part is configured to supply the second current through the second diode coupled transistor.

8. The semiconductor device according to claim 1, wherein the memory unit potential controller stops the supply of the second current when a predetermined current supply time has elapsed after the start of the supply of the second current through the second potential adjustment part.

9. The semiconductor device according to claim 8, wherein the memory unit potential controller comprises a current supply switch signal generation part for generating a current supply switch signal to switch ON and OFF to supply the second current through the second potential adjustment part, and outputting the generated current supply switch signal to the second potential adjustment part, and
    wherein the current supply switch signal generation part outputs the current supply switch signal to stop the supply of the second current, when the predetermined current supply time has elapsed after outputting the current supply switch signal for supplying the second current.

10. The semiconductor device according to claim 9, wherein the current supply switch signal generation part comprises a current supply time adjustment part,
    wherein the current supply switch signal generation part generates a current supply time adjustment signal based on the current supply switch signal, and
    wherein the current supply time adjustment part adjusts the current supply time based on the current supply time adjustment signal.

11. The semiconductor device according to claim 10, wherein the current supply time adjustment part is configured with a load capacitance.

12. The semiconductor device according to claim 11,
wherein the capacitance value of the load capacitance of the current supply time adjustment part is set based on the number of memory cells coupled to the second potential adjustment part.

13. The semiconductor device according to claim 12,
wherein the memory unit comprises a plurality of memory blocks each including the memory cells,
wherein the memory unit potential controller comprises the second potential adjustment part corresponding to each of the memory blocks, and
wherein the capacitance value of the load capacitance is set based on the number of memory cells provided in the memory block.

14. The semiconductor device according to claim 13,
wherein the memory blocks are arranged along a first direction,
wherein in each of the memory blocks, the memory cells are arranged in a matrix form along the first direction and along a second direction, and
wherein the load capacitance is arranged along the second direction, in the vicinity of a memory block at an end on the first direction side.

15. The semiconductor device according to claim 13,
wherein the first potential adjustment part and the second potential adjustment part are arranged along the first direction, in the vicinity of the corresponding memory block on the second direction side.

16. The semiconductor device according to claim 1,
wherein the memory unit potential controller comprises:
a third potential adjustment part provided between the second source and a second end portion of the memory cell; and
a fourth potential adjustment part provided between the first source and the second end portion of the memory cell,
wherein the memory unit potential controller adjusts the potential of the second end portion of the memory cell, based on a third current supplied between the second source and the second end through the third potential adjustment part, the fourth current supplied between the first source and the second end through the fourth potential adjustment part, and the leakage current flowing between the first end portion and second end portion of the memory cell.

* * * * *